United States Patent [19]

Hartley et al.

[11] Patent Number: 5,010,511

[45] Date of Patent: Apr. 23, 1991

[54] DIGIT-SERIAL LINEAR COMBINING APPARATUS USEFUL IN DIVIDERS

[75] Inventors: Richard I. Hartley, Schenectady, N.Y.; Peter F. Corbett, Princeton, N.J.

[73] Assignee: General Electric Company, Schenectady, N.Y.

[21] Appl. No.: 265,210

[22] Filed: Oct. 31, 1988

Related U.S. Application Data

[63] Continuation-in-part of Ser. No. 182,602, Apr. 18, 1988, Pat. No. 4,951,221.

[51] Int. Cl.[5] .......................... G06F 7/50; G06F 7/52
[52] U.S. Cl. ..................................... 364/786; 364/764
[58] Field of Search ............... 364/716, 761, 764, 766, 364/767, 768, 784, 785, 786

[56] References Cited

U.S. PATENT DOCUMENTS

| | | | |
|---|---|---|---|
| 3,816,734 | 6/1974 | Brendzel | 364/785 |
| 4,417,314 | 11/1983 | Beat | 364/716 |
| 4,454,589 | 6/1984 | Miller | 364/716 |
| 4,774,686 | 9/1988 | McClary et al. | 364/785 |

OTHER PUBLICATIONS

Bell et al., "Serial Adder", *IBM Technical Disclosure Bulletin*, vol. 4, #8, p. 37, Jan. 1962.
Larsen et al., *Introductory Experiments in Digial Electronics and 8080A, A Microcomputer Programming and Interfacing*, vol. 2, pp. 115-124.
Howard W. Sams & Co. Inc., Indianapolis, Ia., 1978.

*Primary Examiner*—Dale M. Shaw
*Attorney, Agent, or Firm*—Allen L. Limberg; James C. Davis, Jr.; Marvin Snyder

[57] ABSTRACT

Linear combining apparatus for digit-serial data performs addition, subtraction and comparison functions. The capability of performing addition or subtraction as the result of comparison permits non-restoring division to be done using a plurality of the linear combining apparatuses.

58 Claims, 14 Drawing Sheets

| A | CARRYIN OF 1 + ONE'S (OR BIT) COMPLEMENT OF B | ONE'S (OR BIT) COMPLEMENT OF B | B |
|---|---|---|---|
| 0111 | 1001 | 1000 | 0111 |
| 0110 | 1010 | 1001 | 0110 |
| 0101 | 1011 | 1010 | 0101 |
| 0100 | 1100 | 1011 | 0100 |
| 0011 | 1101 | 1100 | 0011 |
| 0010 | 1110 | 1101 | 0010 |
| 0001 | 1111 | 1110 | 0001 |
| 0000 | (1) 0000 | 1111 | 0000 |
| 1111 | 0001 | 0000 | 1111 |
| 1110 | 0010 | 0001 | 1110 |
| 1101 | 0011 | 0010 | 1101 |
| 1100 | 0100 | 0011 | 1100 |
| 1011 | 0101 | 0100 | 1011 |
| 1010 | 0110 | 0101 | 1010 |
| 1001 | 0111 | 0110 | 1001 |
| 1000 | 1000 | 0111 | 1000 |

*Fig. 6*

DIGIT-SERIAL LINEAR COMBINING APPARATUS USEFUL IN DIVIDERS

This is a continuation-in-part of application Ser. No. 182,602, filed Apr. 18, 1988, now U.S. Pat. No. 4,951,221.

This is a continuation-in-part of Ser. No. 182,602, filed Apr. 18, 1988, now U.S. Pat. No. 4,951,221.

The invention relates to linear combining apparatus as may perform, on a pipelined basis, addition, subtraction, comparison or non-restoring division processes. More particularly, the invention relates to pipe-lined linear combining apparatus for performing these processes on digit-serial data.

BACKGROUND OF THE INVENTION

Digital signals having words of a number W of bits may be subjected to parallel processing, serial processing, or processing that combines features of parallel and serial processing. Parallel processing of the W-bit words wherein the W bits flow in respective bit streams for simultaneous individual processing allows relatively high rates of processing with relatively low latency. However, processing circuitry is in large part replicated W-fold with attendant cost in terms of operating power and digital hardware. In monolithic integrated circuit constructions, more die area is consumed because of the increased hardware requirements. Serial processing, wherein the W bits of each word are sequentially processed, does not require W-fold replication of hardware. However, processing is slower and latency in terms of clock cycles is longer than for parallel processing.

To obtain favorable trade-offs between speed of processing and digital hardware requirements, the W-bit words can each be divided into W/n subwords or digits of n bits each, providing W is a multiple of n. Then, the digits are serially subjected to parallel processing in n parallel bit streams.

M. J. Irwin and R. M. Owens describe a specific system of this general sort in "Digit-Pipelined Arithmetic as Illustrated by the Paste-Up System: A Tutorial", *Computer*, April 1987, pages 73-85. Irwin and Owen espouse a system wherein successive digits of a word are supplied in order of decreasing significance of their bits. Irwin and Owen in FIG. 3 of their article show a pipelined adder for such a system. That adder requires two single-bit addition steps per bit of each digit. Irwin and Owen avoid the need to wait for a carry that ripples up from the least significant end by using signed-digit or redundant arithmetic.

Such arithmetic is described by A. Avizienis in "Signed-Digit Number Representations for Fast Parallel Arithmetic", *IRE Transactions in Electronic Computers*, September 1961, pages 389-400. Signed-digit arithmetic is redundant in that positive and negative digits are differently represented. Essentially, signed arithmetic costs a sign bit per digit, rather than just one sign bit per word. A pipelined arithmetic that is efficient is desirable, however, since a digital hardware saving of almost one-$n^{th}$ would then be possible.

If Irwin and Owen are correct in their opinion that most-significant-digit-first processing mandates redundant arithmetic, then least-significant-digit-first processing must be employed in order to use efficient digits.

S. G. Smith and P. A. Denyer describe the use of an efficient digital arithmetic with two-bit digits in "Radix-4 Modules for Higher-Performance Bit-Serial Computation", *IEE Proceedings*, Vol. 134, Pt. E, No. 6, November 1987, pages 271-276. They denominate normal bit-serial data communication carried out on a single wire as being "radix-two" bit-serial data communication. In radix-two-bit-serial data communication, they note, computational elements have one logical input per input operand. An W-bit data word is transmitted least significant bit first and is processed in W clock cycles, one bit per clock cycle. Smith and Denyer propose what they term "radix-four bit-serial" data communication which is performed concurrently on a pair of wires, one carrying even-numbered bits, the other odd-numbered bits. The concurrent bit pairs, or radix-four digits, represent side-by-side bit places from the data word; and data are transmitted in order of increasing bit significance. That is, the relatively less significant digits of a word are transmitted before the relatively more significant bits of a word. Computational elements for the radix-four digital data have two logical inputs per input operand; and a W-bit, (W2)-digit data word is processed in W2 clock cycles. Radix-four bit-serial data communication is also described in less particular terms in an earlier-published S. G. Smith, M. S. McGregor and P. B. Denyer paper "Techniques to Increase the Computational Throughput of Bit-Serial Architectures", *IEEE Proceedings of ICASSP 1987*, April 1987, pages 543-546.

U.S. patent application Ser. No. 182,602, filed 18 Apr. 1988 by P. F. Corbett and R. I. Hartley, entitled A CELL STACK FOR VARIABLE DIGIT WIDTH SERIAL ARCHITECTURE, assigned to General Electric Company and not acknowledged by this disclosure to constitute prior art adversely affecting the patentability of the present invention, is of interest. This application defines "digit-serial arithmetic" wherein W-bit operand words are grouped on the basis of bit significance into W/n successive digits of n bits each, which digits occur in successive clock intervals in order of increasing significance with passage of time. The n parallel bit streams that provide serial digit flow are accompanied by a control signal identifying the partitioning between successive words. Application Ser. No. 182,602 indicates that digit-serial data processing using digits of four to eight bits usually provides the best tradeoffs between throughput rate and efficient utilization of monolithic-integrated-circuit die area. That is, radix-16, radix-32, radix-64, radix-128, or radix-256 digits are indicated to be generally preferable to radix-four digits. Application Ser. No. 182,602 notes that these optima had not been previously appreciated in the serial computational arts.

Of particular interest in the above-referred-to November 1987 Smith and Denyer paper, insofar as the invention herein described is concerned, is the radix-four cascade adder of FIG. 6b in that paper. This adder is similar to cascade adders for digit-serial numbers for higher radix digits, as described in application Ser. No. 182,602.

A digit-serial linear combining apparatus that provides for comparison of two digit-serial operands as well as for selectively additively or subtractively combining them is attractive, it is here pointed out, since a plurality of such apparatuses may be utilized together with other elements to perform division of one digit-serial operand by another. This can be done using non-restoring division in two's complement, which type of division is generally described on pages 113-116 of Jean-Loup Baer's book *Computer Systems Architecture*, copyright 1980, Computer Science Press, Inc., Potomac, Md., which pages are incorporated herein by reference.

SUMMARY OF THE INVENTION

The invention is embodied in linear combining apparatus for combining first and second digit-serial operands, the words of which have W bits apiece supplied n bits at a time on W/n successive digits during respective clock intervals, n and W/n being plural integers. Generally it is preferable that n be at least three. The n bits of each digit of the first and second operands are identified by respective consecutive ordinal numbers first through $n^{th}$ assigned in order of increasing significance. The linear combining apparatus includes a plurality in number of n full adders respectively identified by consecutive ordinal numbers first through $n^{th}$, each full adder adding a bit of said first operand identified by the same ordinal number as it is either to the bit of said second operand also identified by the same ordinal number or to the complement of that bit. The carry bits generated by each of the first through $(n-1)^{th}$ full adders is applied as carry input signal to the full adder with next higher ordinal number. Either the carry bit of the $n^{th}$ full adder, as delayed by one clock interval, or a forced carry bit is selectively supplied as the carry input signal of the first full adder.

In a preferred embodiment of the invention means are provided for comparing the first and second operands to determine if the second operand is at least as large as the first operand, as well as provision being made selectively to add or to subtract digits of the first and second operands. A plurality of such preferred embodiments of the invention may be used in performing non-restoring division of the first digit-serial operand by the second.

BRIEF DESCRIPTION OF THE DRAWINGS

FIG. 6 is a table useful in understanding of how comparison is done in the FIG. 5 apparatus.

Figure 5:
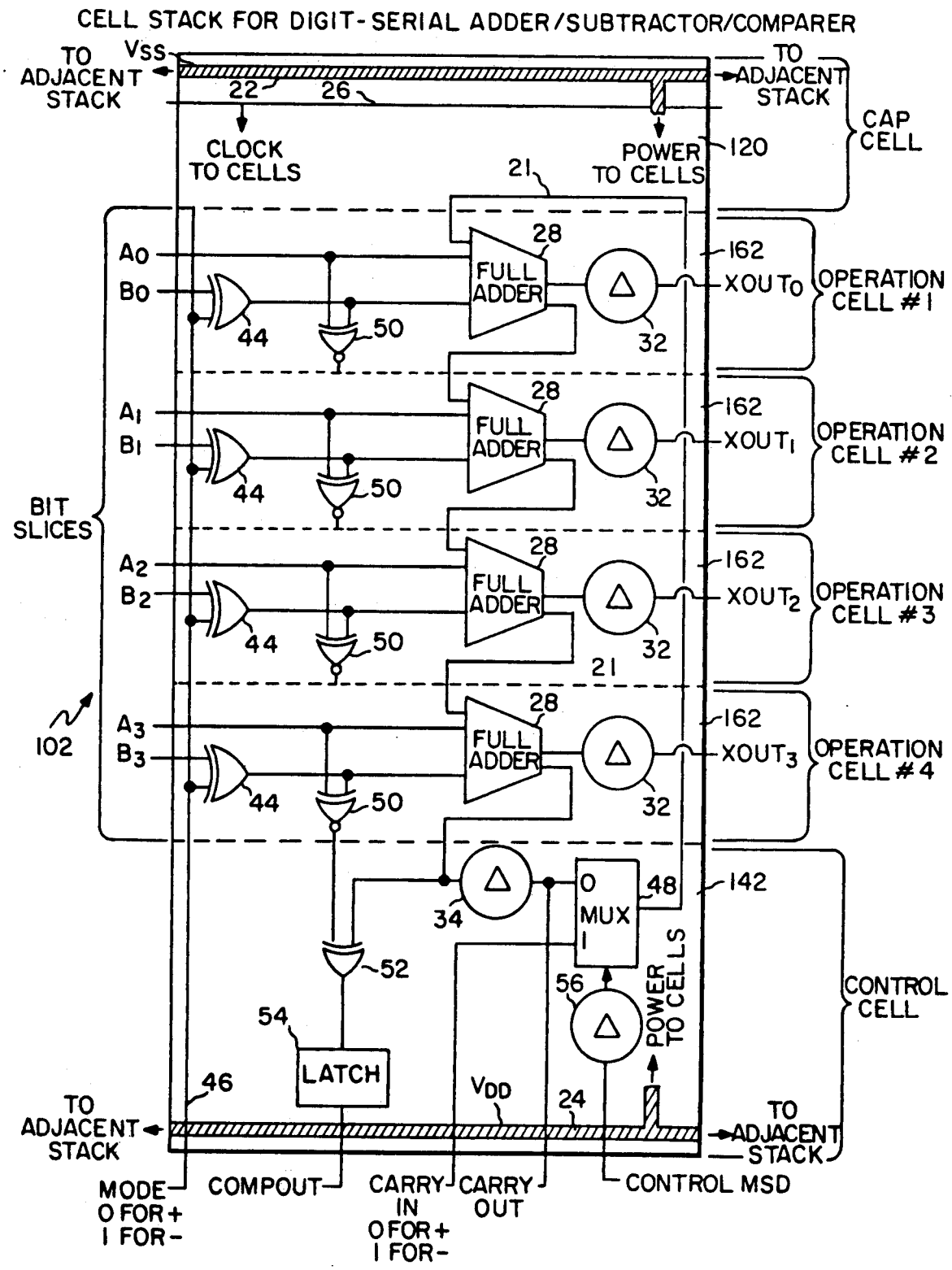
FIG. 5 is a schematic diagram of digit-serial linear combining apparatus which is an embodiment of the invention and provides comparison capability as well both addition and subtraction capabilities.
Figure 7:
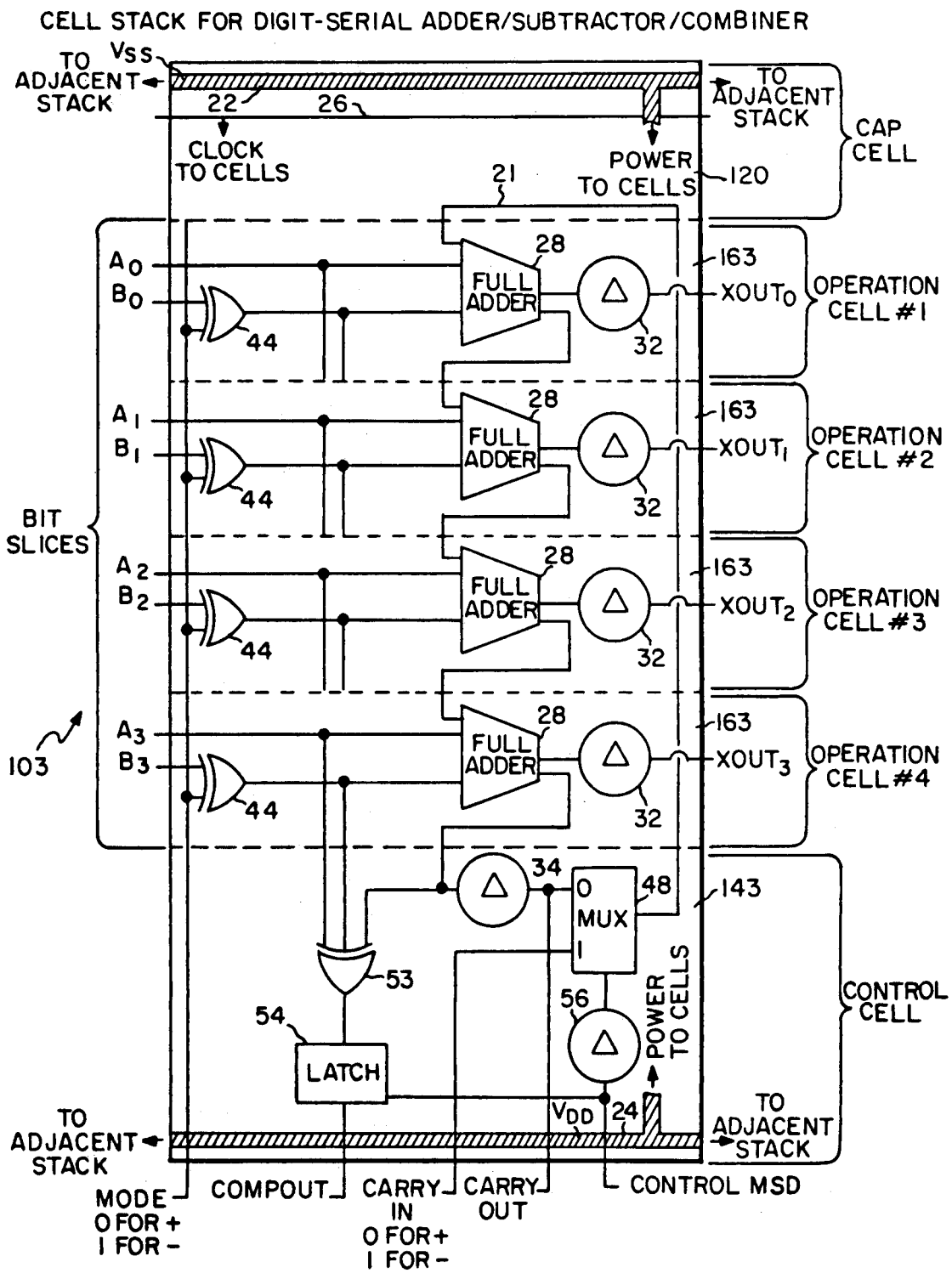
Figure 8:
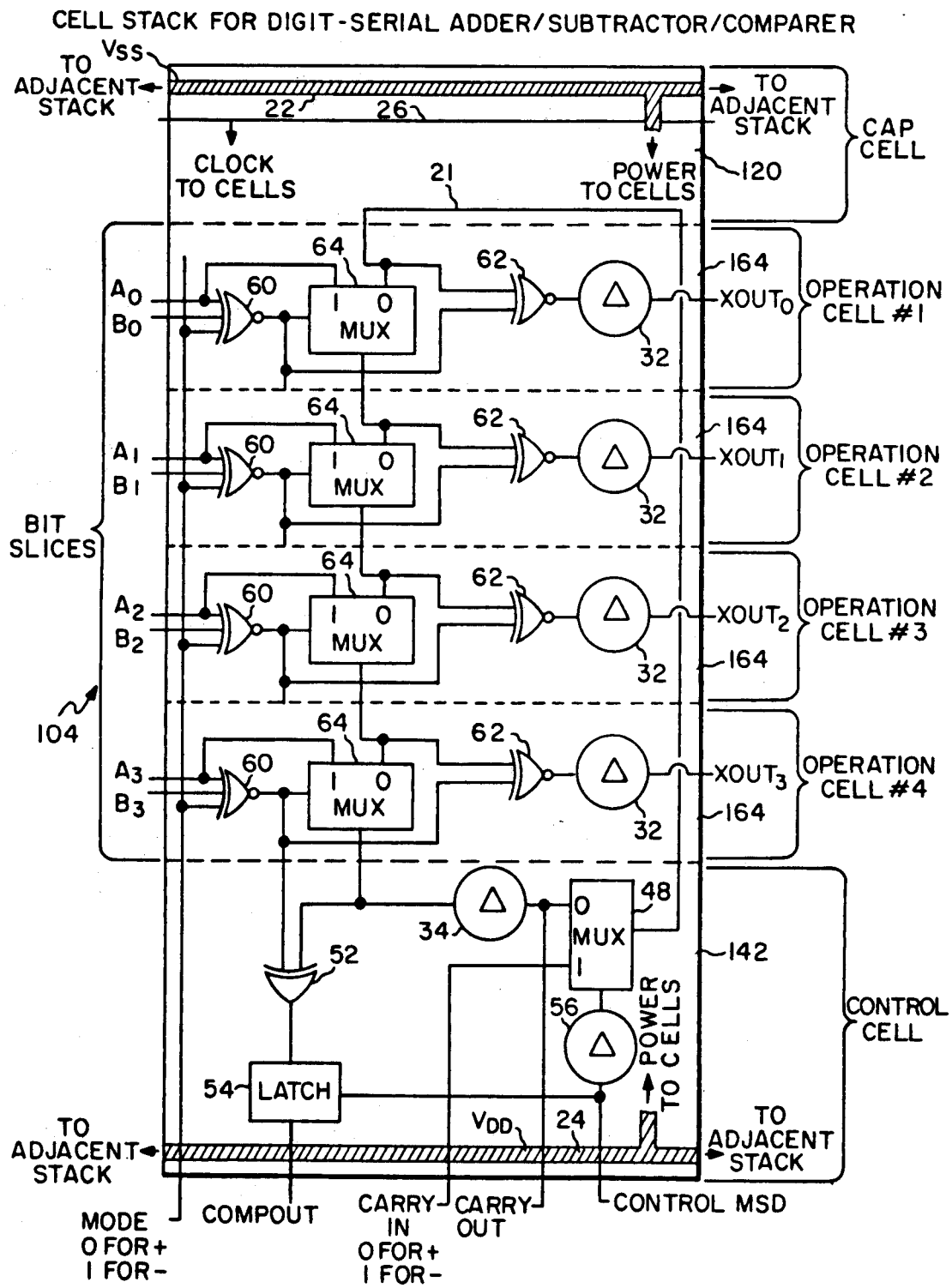

Each of FIGS. 7 and 8 is a schematic diagram of a respective linear combining apparatus, which is alternative to that of FIG. 5 and embodies the invention.

Figure 9:
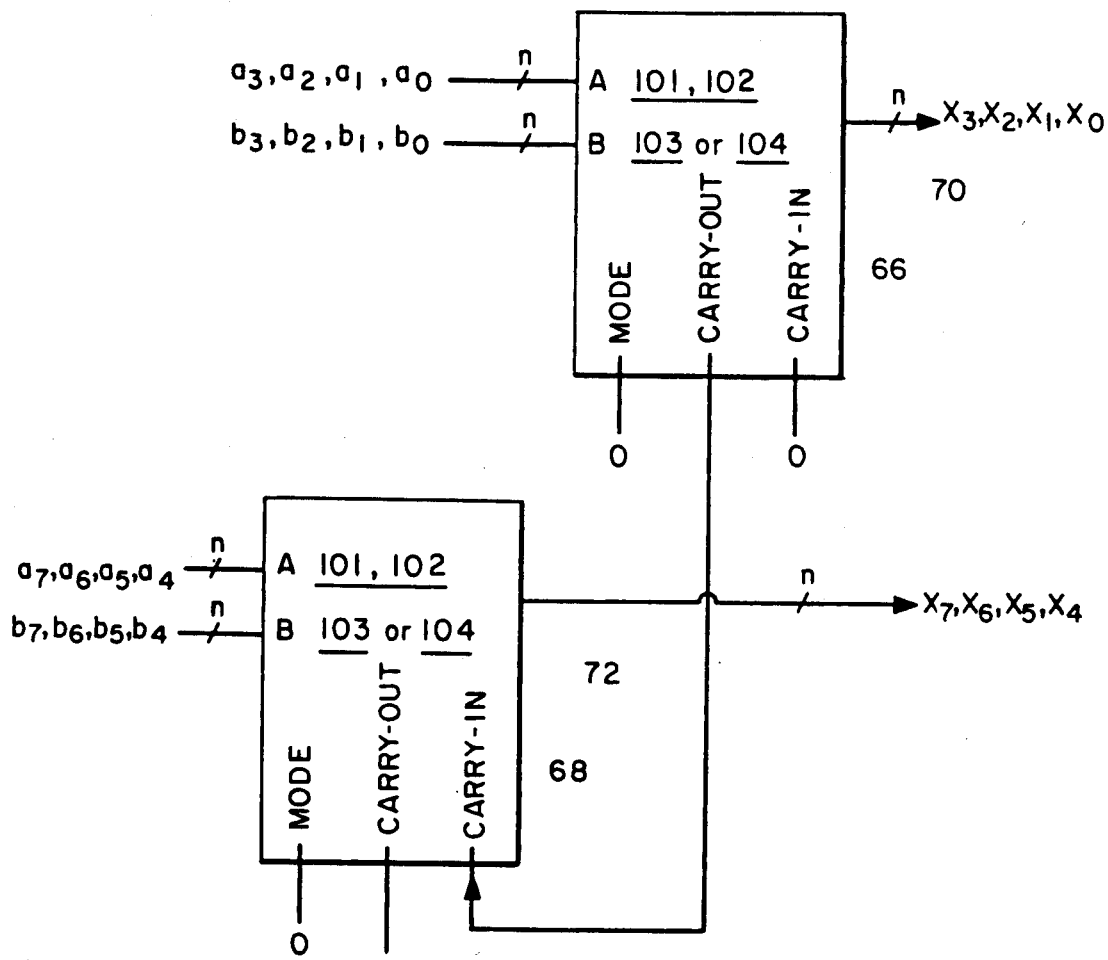

FIG. 9 is a block diagram that shows how two linearing combining apparatuses per FIGS. 2, 4, 5, 7 or 8 can be connected to provide double-precision addition.

Figure 10:
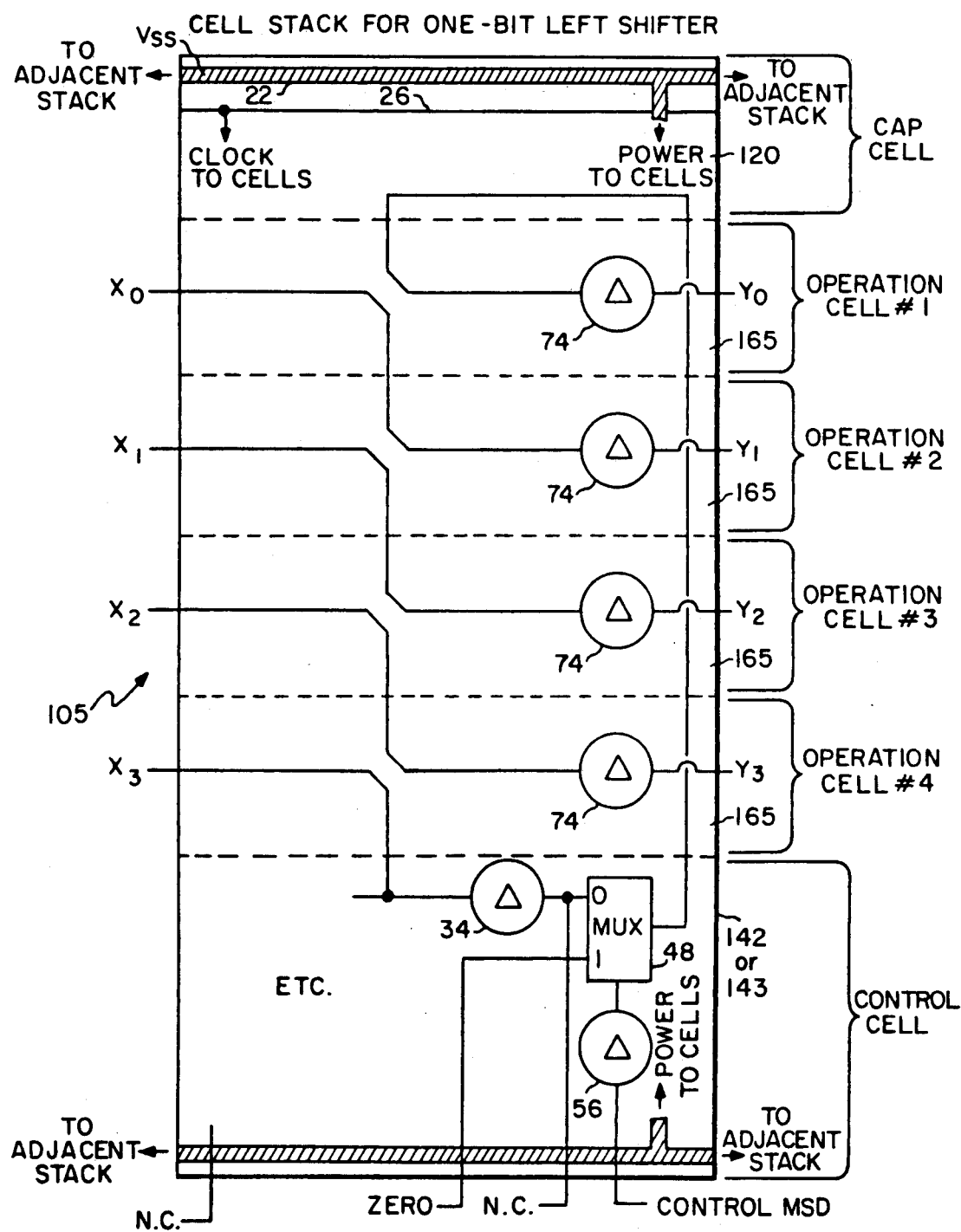
Figure 11:
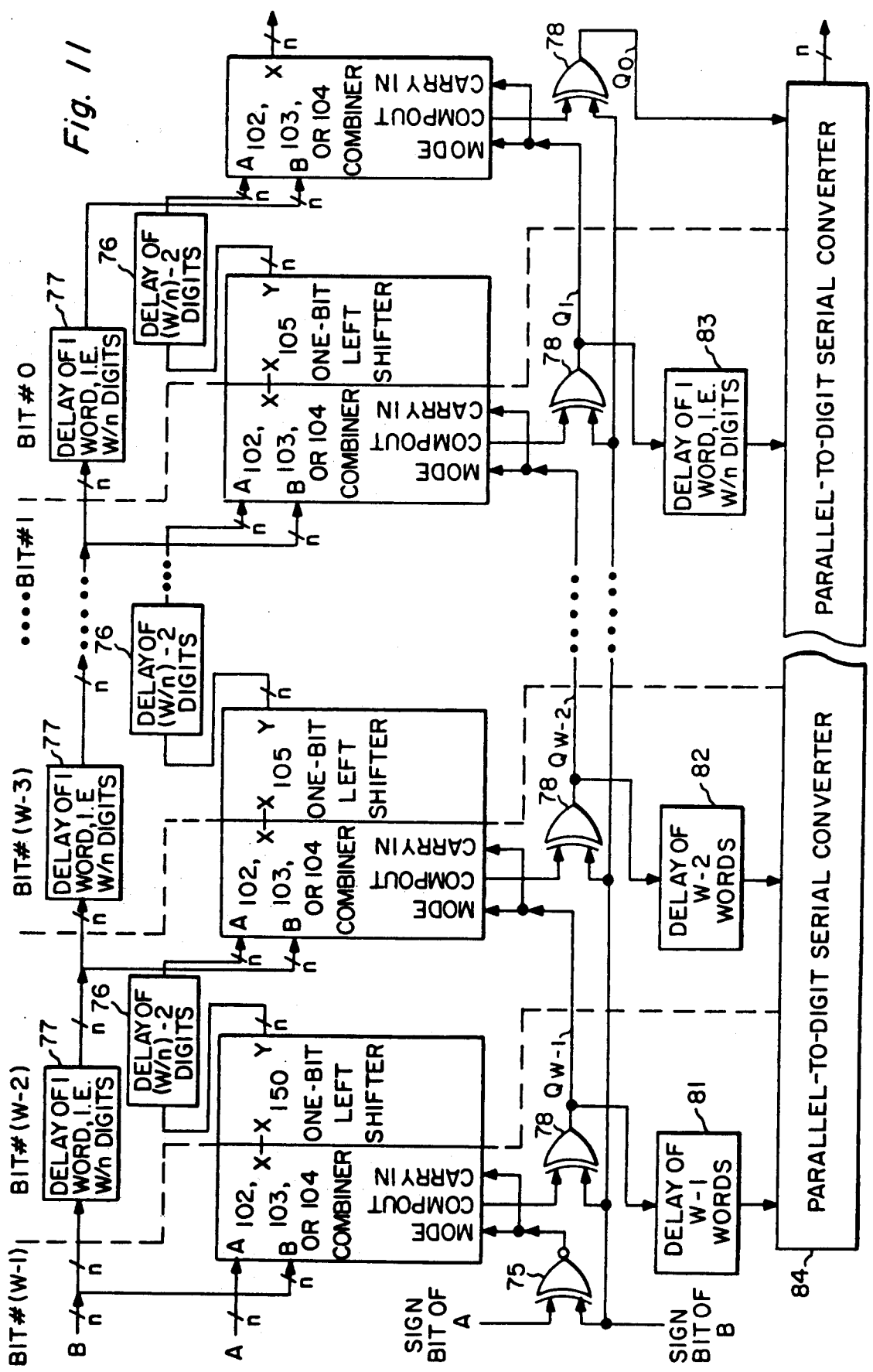

FIG. 10 is a block diagram illustrating a digital shifter for shifting digit-serial arithmetic words one bit place towards increased significance, which shifter is useful in the FIG. 11 circuitry for performing division.

FIG. 11 is a block diagram that shows how a plurality of linear combining apparatuses per FIGS. 5, 7 and 8 can be connected in circuitry for performing division of a first digit-serial operand by a second.

Figure 1:
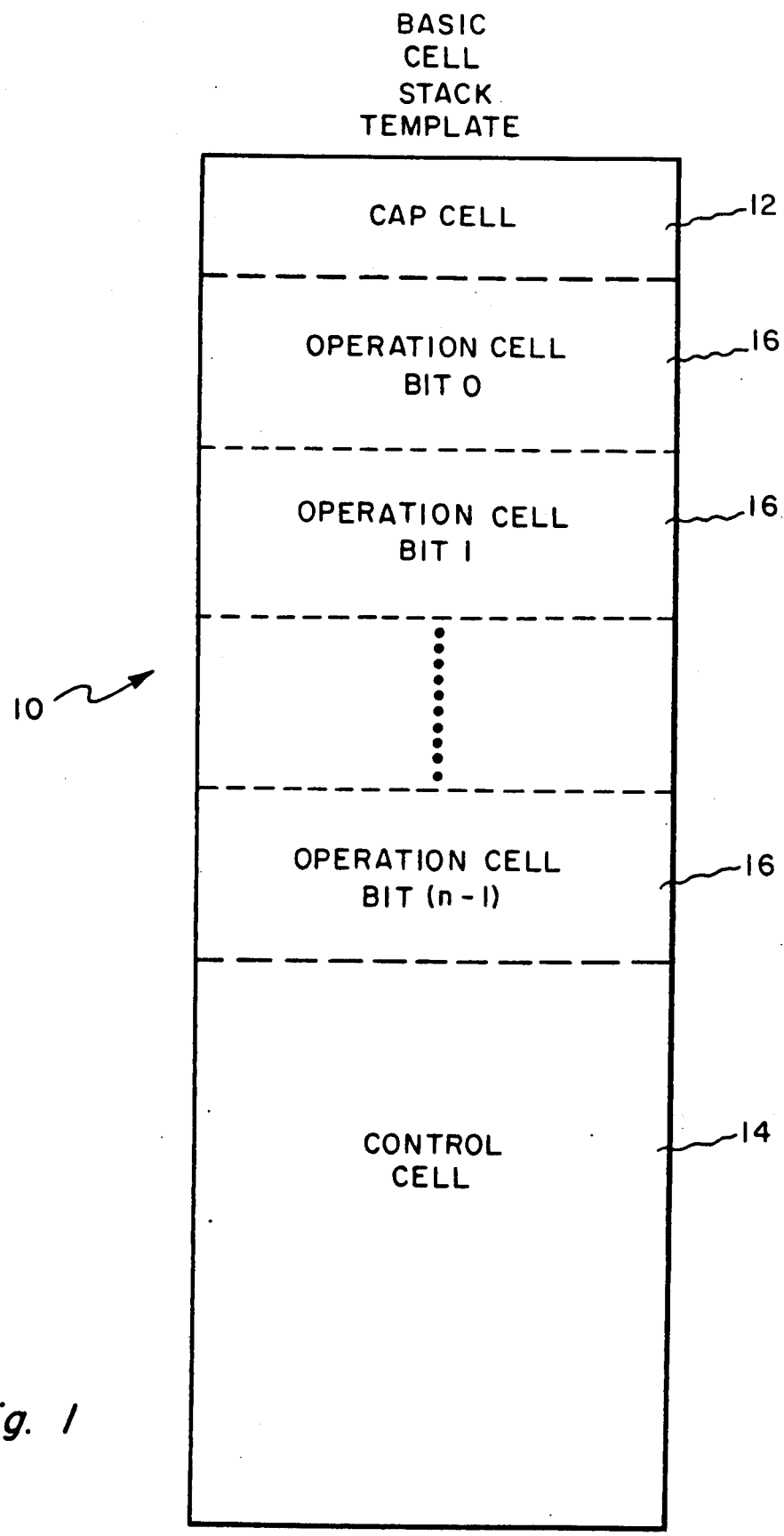
FIG. 1 is a block diagram illustrating the layout for a basic cell stack template that a silicon compiler may use in the generation of a mask-set for a monolithic integrated-circuit digital-serial linear combining circuit embodying the invention.
Figure 12:
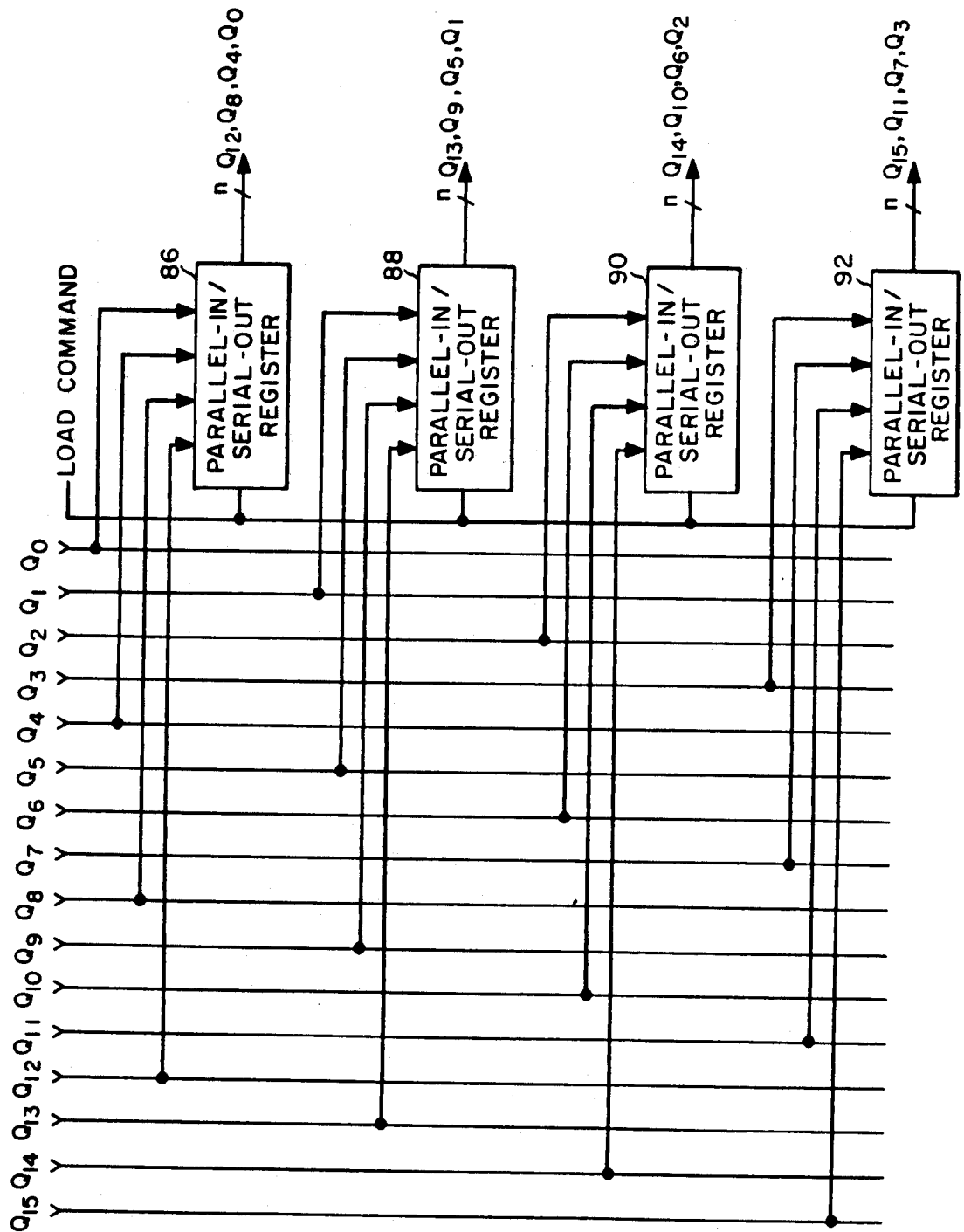

FIG. 12 is a schematic diagram that shows details of a parallel-to-digit-serial converter used in the FIG. 1 circuitry for performing division.

Figure 13:
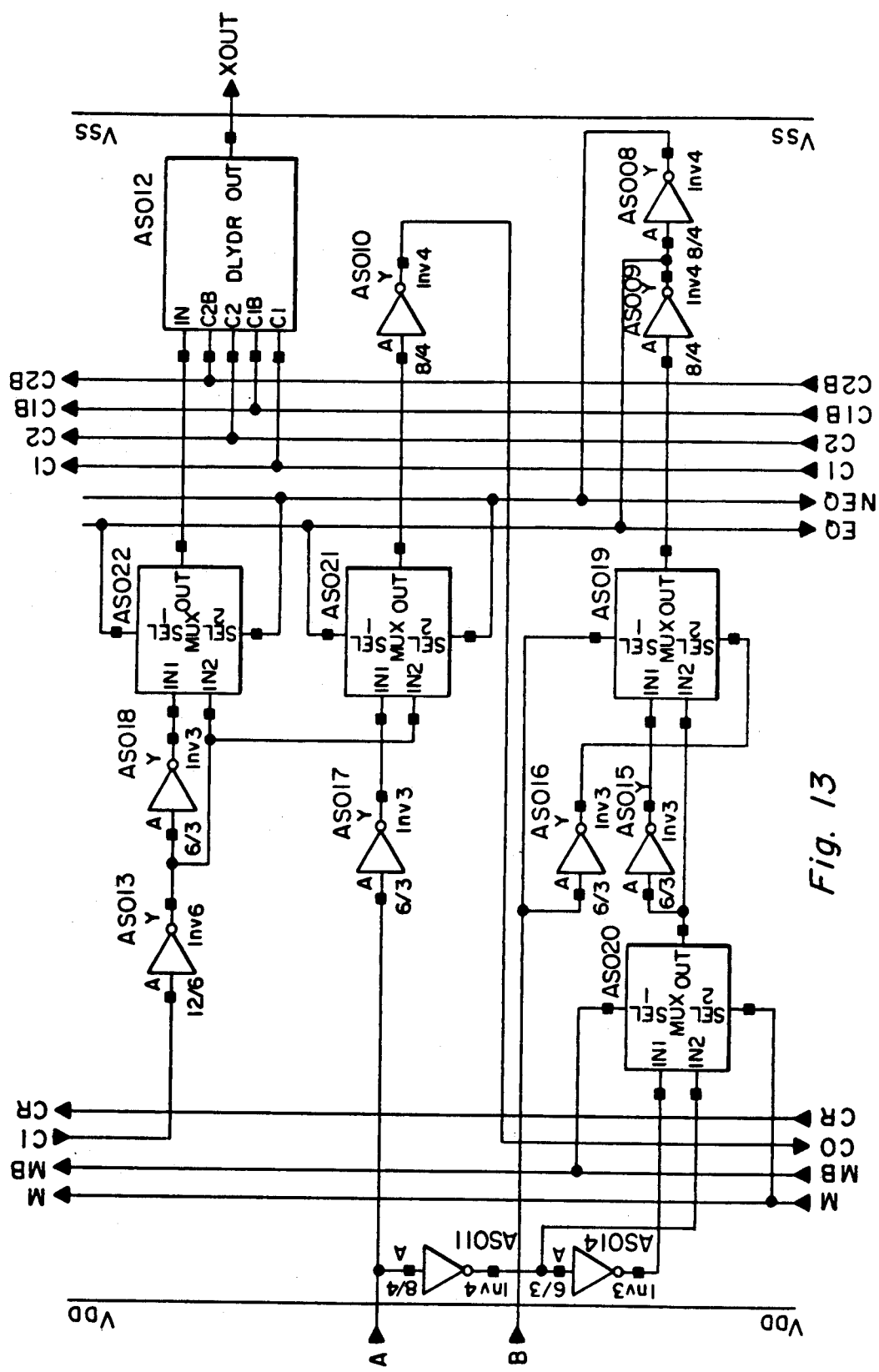

FIG. 13 is a schematic layout diagram that shows details of a bit-slice cell for linear combining apparatus embodying the invention.

Figure 14:
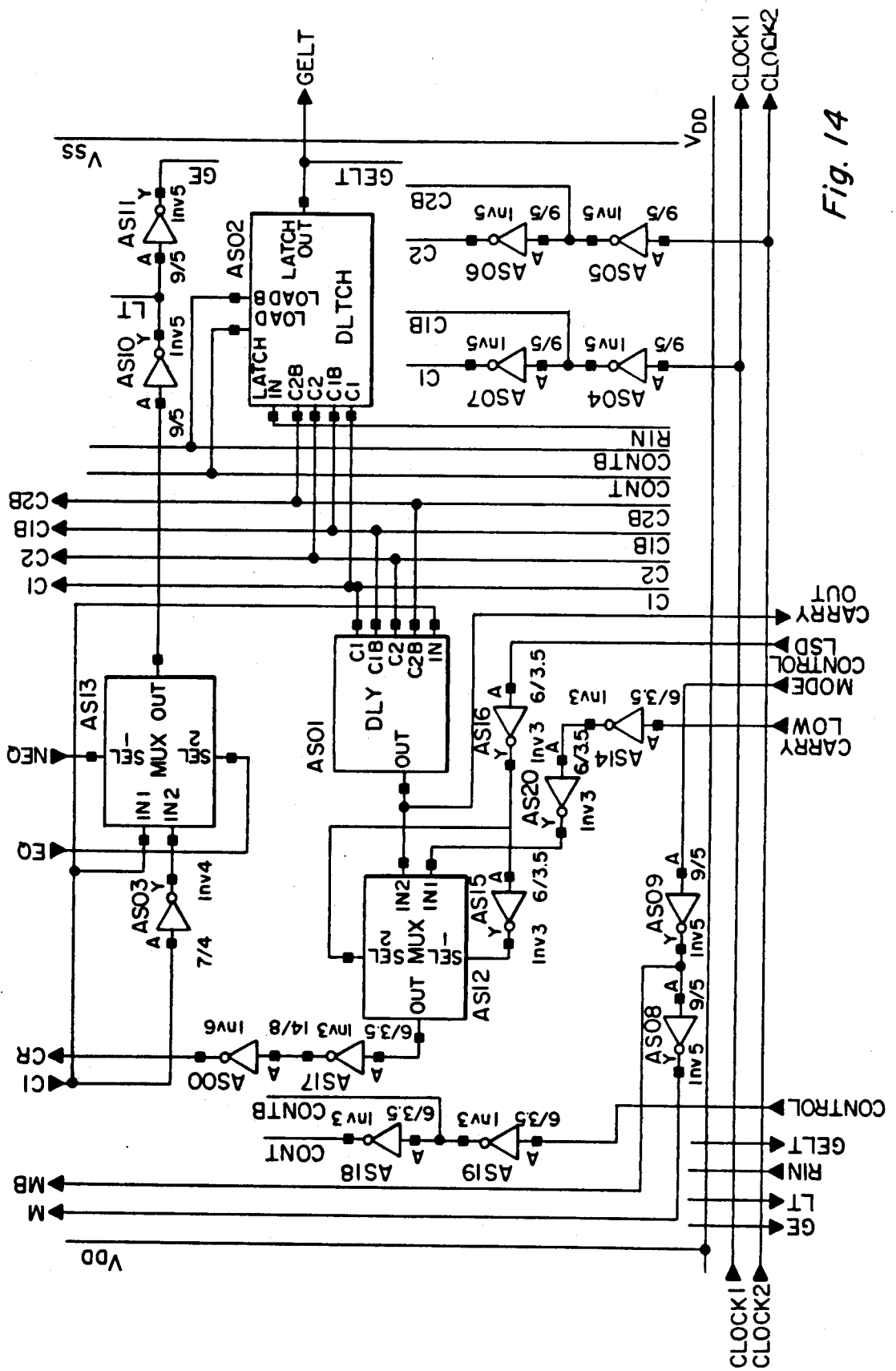

FIG. 14 is a schematic layout diagram that shows details of a control cell for linear combining apparatus embodying the invention.

DETAILED DESCRIPTION OF THE INVENTION

FIG. 1 illustrates, in block diagram form, a cell stack structure convention used by a silicon compiler that is used to generate mask-set for monolithic integrated-circuit digit-serial circuits such as digit-serial linear combining circuits embodying the invention. Cell stack 10 includes a cap cell 12 disposed at the top of a vertical stack of cells. At the bottom of the vertical stack there is a control cell 14. Between cap cell 12 and control cell 14 there are disposed a plurality n, of operation cells 16. The number of operation cells, n, corresponds to the number of bits in the selected digit size. Each of the operation cells 16 is operable to carry out one or more single-bit operations. Cap cell 12, operation cells 16 and control cell 14 are arranged in a vertical stack in which each cell is approximately the same width. Cap cell 12 is employed to carry the $V_{SS}$ power bus and may be used to make minor routing connections. Control cell 14 carries the $V_{DD}$ power bus. These power busses are typically the different polarity power conductors from an operating supply power connection which is made to the chip on which cell stack 10 is incorporated. The cap cell 12 and the control cell 14 are preferably configured to provide continuous conductive paths connecting adjacently disposed cell stacks so that adjacently disposed cell stacks each are connected to the desired power supply conductors. Control cell 14 typically includes circuitry for carrying out tasks such as delaying and resetting carry signals, buffering and inverting clock signals, and performing any other necessary logic control. The function of each control cell 14 generally varies from cell stack to cell stack, presuming the functions of those cell stacks to differ.

For all cell stacks which conform to the basic template shown in FIG. 1, the height of these stacks is constant. Thus, if G and H are two such cell stacks, the control cell for stacks G and H are equal in height. Similarly, the bit slices (operation cell areas) of stacks G and H are equal in height, as are the cap cells. The width of the cell stacks may be different for cell stacks performing different functions. As a result of this standardization of structure, the total cell stack height of all n-bit digit serial operators is the same. The height of a cell stack is given by the following formula:

$$\text{total-height} = \text{cap-height} + \text{control-height} + (n \times \text{slice-height}) \quad (1)$$

Furthermore, power and clock signals, preferably being at standard locations in the control and cap cells, provide matched connections between adjacently disposed cell stacks. Because of this, cell stacks may be placed side by side in rows of cell stacks of equal height. However, it is also possible to provide a small separation or "routing channel" between adjacently disposed cell stacks over which connections may be routed. This is desirable so that cells may be placed and connections between them routed with efficient standard cell place-and-route methods.

While FIG. 1 shows cap cells disposed at the top of a vertical stack and control cells disposed at the bottom of this same stack, it is noted that this is not the only possible arrangement of these three different types of cells within a stack. However, it is the preferred embodiment. It is, however, noted that it would be readily possible to interchange the placement of the control cells and cap cells without significantly affecting the practice of the present invention. Similar objectives could also be obtained simply by disposing the stack cells shown in FIG. 1 in an inverted position. However, in this case, the general signal flow path from one side of the stack to the other is reversed. In fact, this reversal may provide advantages in overall chip layout in which an overall signal flowpath is provided on a chip in a zigzag fashion. The silicon compiler can also pervert cells in its library to provide reversal of signal flow without inverting the stack 10 of cells.

Figure 2:
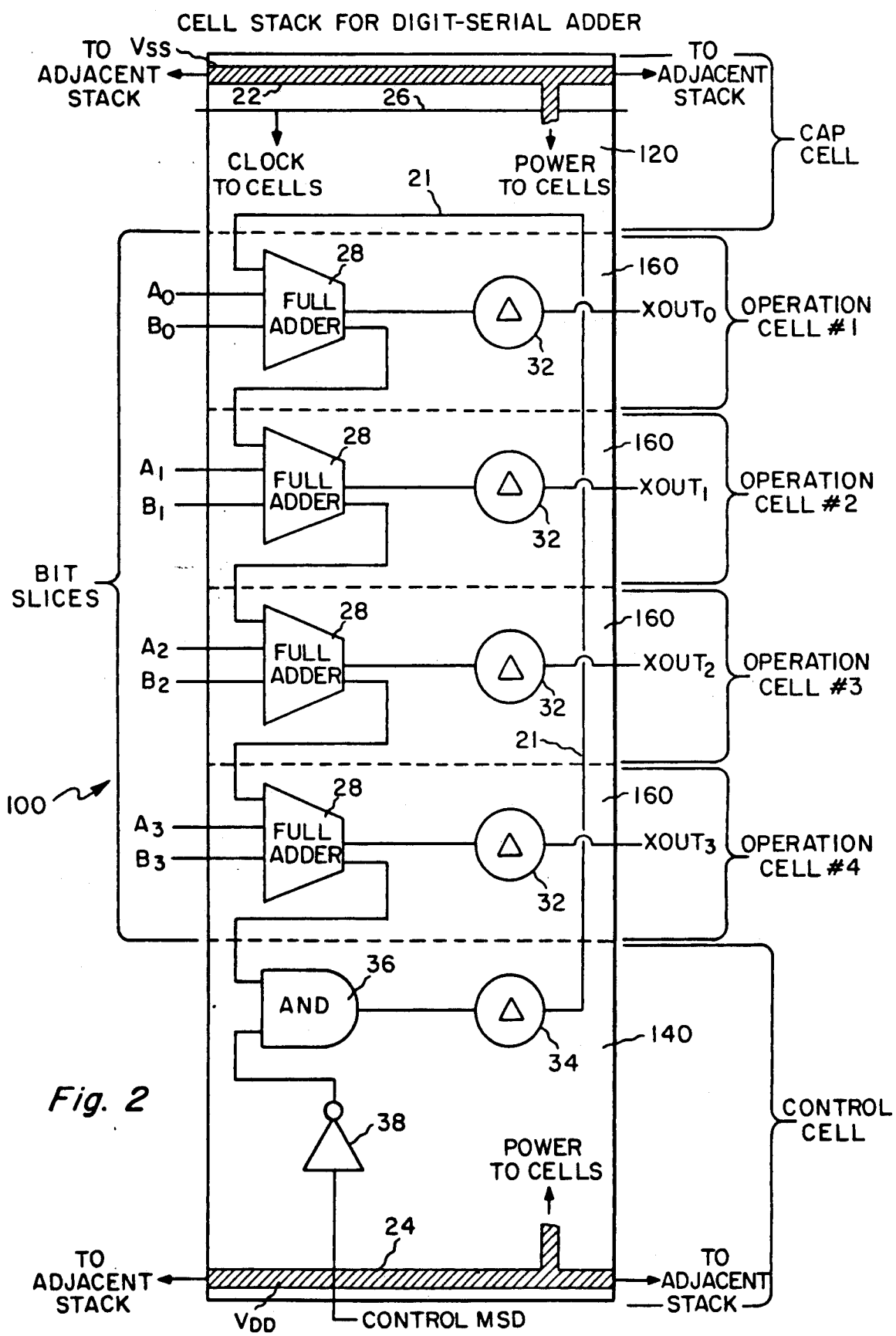
FIG. 2 is a block diagram illustrating a digit-serial adder having a digit width of four bits, which adder is described in U.S. patent application Ser. No. 182,602.

FIG. 2 schematic diagram shows a 4-bit digit-serial adder as described in application Ser. No. 182,602. This adder is of a type that can be configured, as shown, in a stack 100 that conforms to the conventional cell stack 10 arrangement of FIG. 1. Cap cell 120 contains a $V_{SS}$ power bus 22 which is configured to readily connect adjacent cell stacks and also to provide a first operating supply voltage $V_{SS}$ to operation cells 160 and to control cell 140. Likewise, cap cell 120 includes clock line 26 which again is readily connectable to adjacent cells and is operable to supply clock timing signals to each of operation cells 160. Control cell 140 includes a $V_{DD}$ power bus conductor 24 which is likewise readily connectable to adjacent cell stacks. Power bus 24 also supplies to operation cells 160 a second operating supply voltage $V_{DD}$ differing by a few volts from the first operating supply voltage $V_{SS}$.

In the particular embodiment shown, a 4-bit digit-serial adder is described, but the cell stack may be modified to include fewer or more operation cells 160 to accommodate other widths of digit in term of bits. Each operation cell 160 includes full adder 28 receiving digit-serial inputs $A_i$ and $B_i$. Here, i ranges from 0 to 3, reflective of the four bits in each digit. (For convenience, the input ports of the full adders 28 which receive the digit-serial input bits $A_i$ may be denominated "augend" input ports, and the input ports of the full adders 28 which receive the digit serial input bits $B_i$ may be denominated "addend" input ports. It should be understood, however, that the addition operation in a full adder 28 is unaffected by whether an $A_i$ term is added to a $B_i$ term, or vice versa.) The sum output signal of each full adder 28 is supplied to a respective unit-clock-delay block 32, the output ports of which provide digit-serial output data via lines labeled $XOUT_0$ through $XOUT_3$, as shown. The carry-out signal from each of the full adders 28, except that in the last operation cell #4 is supplied as carry-in signal to the full adder 28 in the operation cell with next higher number. Each operation cell 160 is the same. Each operation cell 160 individually performs a single-bit operation; however, collectively these cells perform a 4-bit digit-serial addition operation.

The digit-serial adder shown in FIG. 2 also includes control cell 140 particularly configured to control the flow of carry information (at the digit level). In particular, it is seen that control cell 140 receives control signal information which is inverted by inverter 38 and supplied to AND gate 36, which gate 36 also receives high-order digit carry information from the full adder 28 in the last operation cell #4. In operation, the control cell 140 selects either a ZERO as forced carry bit or the carry-out signal from the full adder 28 processing most significant bits of the digit; delays the selected bit one cycle by passage through a unit-clock-delay block 34 and supplies the delayed bit the next clock cycle, as carry-in signal to the full adder 28 in the first operation in cell #1. Control cell 140 selects the ZERO as forced carry bit in a reset operation. This reset operation is shown in FIG. 2 as being controlled by the control signal line labeled CONTROLMSD in FIG. 2 which is high (ONE) only in the last, most significant digit of each data word. The forced carry reaches the full adder 28 in the first operation cell #1 input signals during the first digit of the next word.

In general, data words are divided into a plurality of digits, each of size n. For example, if the word size is W and the digit size is n, there will, in general, be W/n passages of information through the adder cell stack to effect the addition of two words of W bits each. Where the number n of bits per digit is only three, cell stack 100 is modified to omit operation cell #4, the carry output signal from the full adder 28 in cell #3 is applied to AND gate 36 in control cell 140, and provision is made for continuing to apply the carry output signal from delay block 34 to line 21. Where the number n of bits per digit is greater than n by some integer m, cell stack 100 is modified by inserting in additional operation cells 160 into the stack.

In an alternative adder embodying the invention, delay block 34 could be relocated to the input connection of AND gate 36 from the last full adder 28, and the control signal received via inverter 38 would be a CONTROLLSD signal that would be high (ONE) only during the first, least significant digit of each data word. It is also noted that while carry signal line 21 is shown in FIG. 2 as being completely disposed in the cell stack 100, alternatively line 21 can be routed over a routing channel 42 between adjacently disposed cell stacks, as will be discussed in greater detail further on in connection with FIG. 3.

In FIG. 2, input data signals are supplied from the left, and output data signals are taken from the right-hand side of the cell stack 100. However, it is noted that operation cells 160 may be laid out in reverse fashion, with data signals being directed to the left. In fact, it may be desirable to employ both kinds of cell stacks on the same chip. That is to say, on a given chip employing the present invention, data signals are not limited to flowing from either the left to the right or from the right to the left in a given cell stack. However, consistency in flow direction is generally advisable between adjacently disposed and electrically connected cell stacks.

Figure 3:
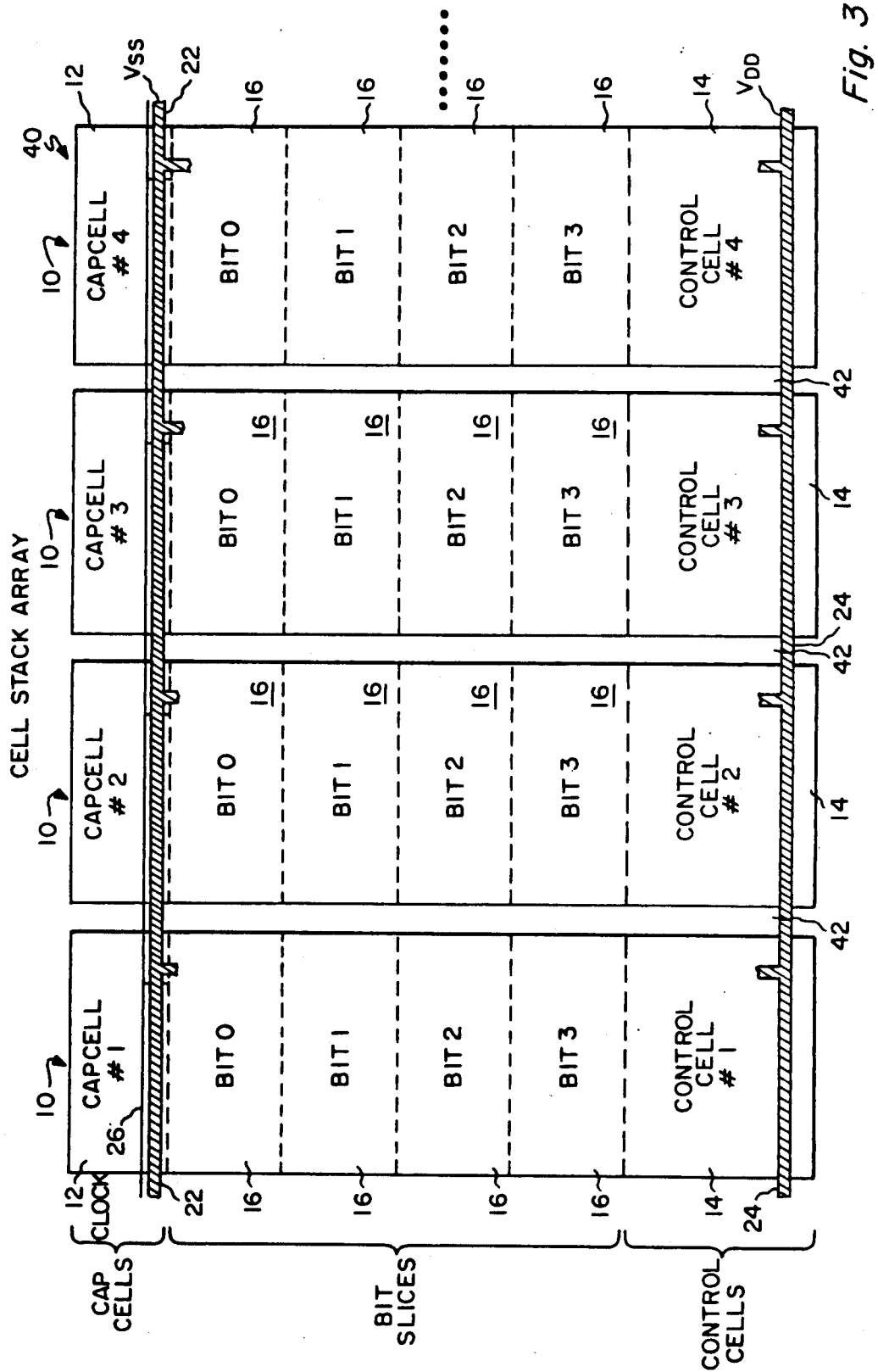
FIG. 3 is a block diagram illustrating an array of cell stacks arrayed in a row, at least one of which is a digit-serial linear combining circuit embodying the invention.

FIG. 3 illustrates a cell stack array 40 assembled from a plurality of cell stacks 10, one or more of which may be a digit-serial adder of the sort shown in FIGS. 2, 4, 5 or 6 or their like. In particular, different cell stacks 10 from a relatively small library of cell stack operators can be seen to be readily configured in adjacent locations. It is seen that power busses 22 and 24 are readily connected between adjacent cell stacks 10. The same is true for the clock signal 26. Furthermore, clock signal line 26 is shown as being present in cap cell 12. It is also possible to dispose a clock signal line in control cell 14, as well, or instead.

A particular advantage of the general cell stack configuration depicted in FIG. 1 is that the cell library does not have to contain and maintain a large number of different cell stack operators for different digit sizes. The digit size is entirely controllable simply by changing the stack height and by including the appropriate number of bit-slice operation cells 16. Extremely flexible design is facilitated without sacrificing layout efficiency.

Cell stacks 10 shown in array 40 of FIG. 3 may actually comprise different kinds of digit-serial operators. Accordingly, the cell stacks are typically of varying widths even though a constant width is illustrated in FIG. 3. Nonetheless, the cell stack height is substantially constant for given bit-width digits. In those signal processing applications in which data may be passed directly from one operator stack to the next, it is possible to dispose the cell stacks in substantially abutting relationships. However, in those situations in which it is desirable to re-route signal or control signal lines between cell stacks, it is desirable to employ routing channel 42 which is disposed between adjacent cell stacks. For example, signal line 21 shown in FIG. 2 may in fact be disposed in one of these routing channels rather than being disposed within the operation cells. In this case, it is a matter of design choice which of the two locations for signal line 21 is selected.

A FIG. 3 cell stack array wherein each cell stack is a digit-serial adder per FIG. 2, or its like, may be used for chain addition wherein an auguend is successively incremented with a plurality of addenda, with each successive addendum being added by a respective cell stack 10, that is configured like cell stack 100. Each successive addendum is subjected to one more unit clock delay than its predecessor to compensate for the latency of the preceding cell stack 100. In such arrangement, the partial sum signal generated by the respective digit serial adder in each of these cell stacks 10 (or 100) crosses the routing channel 42 at the right of that cell stack 10 to supply the auguend for the cell stack 10 (or 100) at its left. Each of the respective addenda for the cell stacks, except perhaps the addendum for the cell stack at extreme left, is directed down signal lines running down the routing channel 42 at the left of that cell stack 10.

Figure 4:
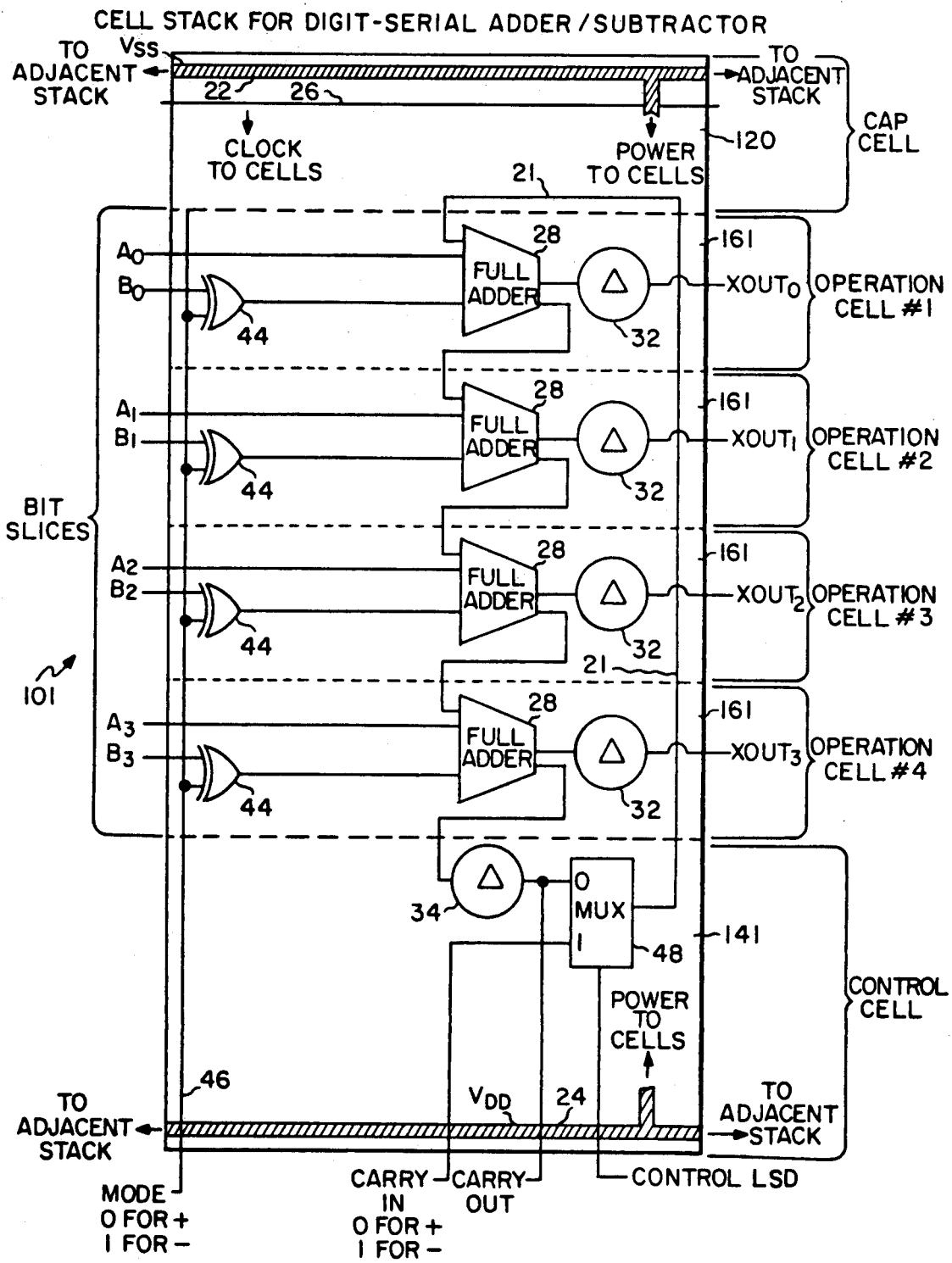
FIG. 4 is a schematic diagram of digit-serial linear combining apparatus having a digit width of four bits, which linear apparatus is an embodiment of the invention and provides subtraction capability as well as addition capability.

A FIG. 3 cell stack array can also be configured to perform chain addition or subtraction using linear combining apparatuses per FIGS. 4, 5 or 6 as will become apparent after reading the descriptions of those figures occurring further on in this application. Chain additions or subtractions can, of course, be performed on a tree rather than a cascade basis to reduce latency time for obtaining final result; this will complicate routing of interconnections somewhat, but will save some unit delay blocks.

This specification will describe the use of exclusive-OR or XOR gates, and it will describe the use of exclusive-NOR gates. Since some of these gates will have more than the two input signals normally encountered in practice, the definition of those gates is now reviewed. An exclusive-OR gate is a logic device that generates an output signal that is a ONE responsive to each of only an odd number of its input signals being a ONE and each other of its input signals being a ZERO, and otherwise generates an output signal that is a ZERO. An exclusive-NOR gate is a logic device that generates an output signal that is a ZERO responsive to each of only an odd number of its input signals being a ONE and each other of its input signals being a ZERO, and otherwise generates an output signal that is a ONE.

FIG. 4 shows a cell stack 101 that operates a digit-serial adder/subtractor. That is, cell stack 101 provides a digit-serial linear combining apparatus that can perform signed additions, both positive additions and negative additions or subtractions. Cell stack 101 can be operated as an adder or as a subtractor depending on signals applied to its control cell 141. The operation cells 161 of cell stack 101 differ from operation cells 160 of cellstack 100 of the digit-serial adder in that exclusive-OR gates 44 are included as shown in FIG. 4 to perform (on a selective basis) bit complementation of the $B_i$ signals as they are applied to full adders 28. Each $B_i$ input signal (where i is the operation cell number less one) is supplied as one input of an XOR gate 44, the other input of which connects to a bus 46 shared by all the operation cells 161. Bus 46 is receptive of a MODE command, which is a ZERO when addition is being done and is a ONE when subtraction is being done by the FIG. 4 adder/subtractor. During addition, responsive to the ZERO applied to bus 46, the XOR gates 44 respond to the $B_i$ bit signals to repeat them for application to full adders 28. During subtraction, responsive to the ONE applied to bus 46, the XOR gates 44 respond to the $B_i$ bit signals with their bit complements for application to full adders 28.

Again, for convenience, the input ports of the full adders 28 receptive of $A_i$ bits may be denominated "auguend" input ports, but they may alternatively be denominated "minuend" or "auguend/minuend" input ports in recognition of the role they take during subtraction. Similarly the input ports receptive of $B_i$ bits may be denominated "addend" input ports, but they may alternatively be denominated "subtrahend" or "addend/subtrahend" input ports.

When doing subtraction, the carry input supplied at the beginning of such subtraction to the full adder 28 of operation cell #1 via line 21 must be a ONE, rather than the ZERO supplied at the beginning of each addition. The initial carry bit be it a ONE or ZERO is applied to the CARRYIN input of control cell 141 for application to a multiplexer 48, which selects this signal to line 21 during the initial least significant digits of the arithmetic words A and B being linearly combined. This selection is made responsive to the CONTROLLSD command supplied on CONTROLLSD input to control cell 141 during these initial digits of the arithmetic words A and B being a ONE. During the later digits when the CONTROLLSD signal is a ZERO, multiplexer 48 selects the carry output of the full adder 28 in the last operation cell #4 as delayed by delay block 34 for application to line 21.

The reason for placing multiplexer 48 after delay block 34 and controlling it with CONTROLLSD rather than CONTROLMSD signal is that CARRYIN signal is then temporally aligned with MODE signal for the case where the linear combining apparatus is called upon to intermix positive additions and negative additions or subtractions. When MODE signal is a ONE during subtraction that same ONE can be applied as CARRYIN signal, eliminating the need to forecast the MODE signal in order to ascertain the CARRYIN signal. The reason for keeping the MODE and CARRYIN signals separate, however, is to implement dual-or multiple-precision additions or subtractions. Dual-precision addition or subtraction will be discussed further on, in connection with FIG. 9 of the drawing.

The FIG. 5 linear combining apparatus is not only an adder/subtractor, but also provides for comparing operand B with operand A to determine if operand B is at least as positive (or large) as operand A or if it is more negative (or smaller) than operand A. Theoretically such comparison can be made by subtracting operand B from operand A and noting the sign of the resulting difference. When the possibility exists that the subtraction will cause overflow in the difference, however, the sign bit of the difference may provide "erroneous" comparison result.

Consider, for example, the subtraction of a B operand of minus four, from an A operand of plus five, assuming a word of four bits. Four-bit two's complement numbers have a range from minus eight to plus seven, and the plus nine result of subtracting minus four from plus five will overflow this range. The normal subtraction procedure for two's complement numbers is to perform bit complementation on the subtrahend before adding it to the minuend as augmented by a number consisting of all ZEROs except for a ONE in the least significant bit place. Complementing the bits 1100 of minus four provides a number 0011 to be added to plus five, 0101, and to 0001. The result of adding 0011, 0101, and 0001 is 1001 or minus seven, an "error" caused by the wrap around of plus nine overflow into the bottom of the negative number field. The sign bit of minus seven is a ONE, rather than a ZERO, which incorrectly indicates operand B to be at least as positive as operand A.

The correct sign of the result of an addition or subtraction process can be determined without error, dependent not only in the sign bit of the result, but also dependent on the value of the overflow or carryout bit $C_{MSB}$ from the full adder for sign bits. The difference $(A-B)$ is greater than or equal to zero if and only if $C_{MSB}$ is a ONE, providing A and B are alike in sign and CARRYIN is a ONE. The difference $(A-B)$ is greater than or equal to zero if and only if $C_{MSB}$ is a ZERO, providing A and B differ in sign and CARRYIN is a ONE. The difference $(A-B)$ is less than or equal to zero if and only if $C_{MSB}$ is a ZERO, providing A and B are alike in sign and CARRYIN is a ZERO. The difference $(A-B)$ is less than or equal to zero if and only if $C_{MSB}$ is a ONE, providing A and B differ in sign and CARRYIN is a ZERO.

FIG. 6 is a table that provides an aid for understanding why these postulated rules are so when arithmetic words have four bits. The reader after reading the following explanation of the FIG. 6 aid should be able to develop or to imagine more extensive tables as aids for understanding why these postulated rules are so for words having other numbers of bits.

Column A at left of FIG. 6 table lists from bottom to top the ascending values of operand A from minus eight to plus seven in two's complement binary numbers. The column next to the right, but left of the middle of the table, lists in the same row as each operand A value in column A that two's complement binary number which when added to that operand A value would be just sufficient to cause carry-out overflow—i.e., to make $C_{MSB}$ a ONE.

Subtraction of operand B from operand A is implemented in two's complement binary numbers by adding to A the one's (or bit) complement of B and to an input carry bit of a least-significant-bit ONE. (The input carry may be thought of as a number with ZEROs in all bit places except the ONE in the least-significant bit place). Column B at right of FIG. 6 table lists in the same row as each value of operand A in column A that value of operand B that would have to be one's complemented and augmented by input carry of ONE to generate the value in the same row in the column just to the right of column A. The column just to left of column B lists in each row thereof the one's (or bit) complement of the value of operand B in the same row in column B, to help in understanding the steps of the procedure used during subtraction to progress from column B to the second column t the left of column B.

There are now only four general cases of how operands A and B compare to each other to be considered in order to validate the rules previously postulated with regard to how the carry-out overflow bit $C_{MSB}$ can be used to determine the results of comparing operands A and B. In considering these four general cases, the sign bit of the A operand will be designated $S_A$ and the sign bit of the B operand will be designated $S_B$. $S_A$ and $S_B$ are the most significant bits of the two's complement operands A and B, respectively.

The first case to be considered is when A and B are both positive—i.e., $S_A$ and $S_B$ are both ZEROs. Referring to FIG. 6 table, one notes if operand B is in a row lower than that of operand A—i.e., $A>B$ or $(A-B)>0$—the one's complement of operand B even as not augmented by input carry of ONE is large enough to cause $C_{MSB}$ to be a ONE. If operand B is in a row higher than that of operand A—i.e., A B or $(A-B)<0$—the one's complement of operand B even as augmented by input carry of ONE is not large enough to cause $C_{MSB}$ to be a ONE, so $C_{MSB}$ is a ZERO. If operands A and B are in the same row—i.e., $A=B$ or $(A-B)=0$—$C_{MSB}$ will be ONE if input carry of ONE is applied and will be ZERO if it is not. So, $(A-B) \geq 0$, if and only if $C_{MSB}$ is ONE, and $(A-B)<0$ if and only if $C_{MSB}$ is ZERO, both providing input carry of ONE is applied. Alternatively, $(A-B)>0$, if and only if $C_{MSB}$ is ONE, and $(A-B) \leq 0$ if and only if $C_{MSB}$ is ZERO, both providing input carry of ZERO is applied.

The second case to be considered is when A and B are both negative—i.e., $S_A$ and $S_B$ are both ONEs. Referring to FIG. 6 table, one notes if operand B is in a row lower than that of operand A—i.e., $A<B$ or $(A-B)>0$—the one's complement of operand B even as not augmented by input carry of ONE is large enough to cause $C_{MSB}$ to be a ONE. If operand B is in a row higher than that of operand A—i.e., A B or $(A-B)$ 0—the one's complement of operand B even as augmented by input carry of ONE is not large enough to cause $C_{MSB}$ to be a ONE so $C_{MSB}$ is a ZERO. If operands A and B are in the same row—i.e., $A=B$ or $(A-B)=0$—$C_{MSB}$ will be ONE if input carry of ONE is applied and will be ZERO if it is not. So, $(A-B) \geq 0$, if and only if $C_{MSB}$ is ONE, and $(A-B)<0$ if and only if $C_{MSB}$ is ZERO, both providing input carry of ONE is applied. Alternatively, $(A-B)>0$, if and only if $C_{MSB}$ is ONE, and $(A-B) \leq 0$ if and only if $C_{MSB}$ is ZERO, both providing input carry of ZERO is applied. Comparing the observations made concerning the first and second cases, they are the same.

The third case to be considered is when A is positive and B is negative—i.e., $S_A$ is a ZERO and $S_B$ is a ONE. In such case (A−B) will invariably exceed zero. Referring to FIG. 6 table, one notes that even the largest positive A operand 0111 when added to the largest complement 1111 of B operand, whether or not augmented by a CARRYIN of ONE (0001), does not result in overflow to cause $C_{MSB}$ to be a ONE. If a ONE indication of A−B≧0 is required, $C_{MSB}$ must be one's complemented.

The fourth case to be considered is when A is negative and B is positive—i.e., $S_A$ is a ONE and $S_B$ is a ZERO. In such case (A−B) will invariably be smaller than zero. Referring to the FIG. 6 table, one notes that even the smallest binary number 1000 as negative A operand when added to even the smallest complement 1000 of a positive B operand, whether or not augmented by a CARRYIN of ONE (0001), invariably results in overflow to cause $C_{MSB}$ to be a ONE. If a ZERO indication of A−B≧0 is required, $C_{MSB}$ must be one's complemented.

Whether one of the first and second cases obtains, or whether one of the third and fourth cases obtains can be distinguished, either by applying $S_A$ and $S_B$ to an exclusive-OR gate to obtain its response, or by applying $S_A$ and $S_B$ to an exclusive-NOR gate. The $C_{MSB}$ can then be selectively complemented, not to be complemented when one of the first and second cases obtains, and to be complemented when one of the third and fourth cases obtains.

FIG. 5 shows each operation cell 162 in cell stack 102 including an exclusive-NOR gate 50. The exclusive-NOR gate 50 in the last operation cell (#4) the full adder 28 of which cell supplies $C_{MSB}$ as its carry output receives $A_3$ which during the last digit of the digit serial operand A corresponds to $S_A$. That exclusive-NOR gate 50 also receives from exclusive-OR gate 44 the one's complement of $B_3$; $B_3$ during the last digit of the digit serial operand B corresponds to $S_B$, so the one's complement of $B_3$ corresponds to $\bar{S}_B$ during that digit. The logic response of exclusive-NOR gate 50 in operation cell #4 is the logic complement of $S_A \oplus \bar{S}_B$, where the circled plus sign signifies the exclusive-OR operation. The logic complement of $S_A \oplus \bar{S}_B$ can be shown by comparison of truth tables to be equal to $S_A \oplus S_B$. Exclusive-NOR gate 50 in operation cell #4 supplies a ZERO when the first or second case of $S_A$ or $S_B$ conditions obtains and a ONE when the third or fourth case obtains.

An exclusive-OR gate 52 in a control cell 142 of cell stack 102 selectively complements $C_{MSB}$ from full adder 28 in the last operation cell (#4) in accordance with the output signal from exclusive-NOR gate 50 in that operation cell. The $S_A \oplus S_B \oplus C_{MSB}$ response of XOR gate 52, when MODE signal is a ONE, appears during the last digits of operands A and B, and this response is latched by latch 54 at that time responsive to a CONTROLMSD input signal to control cell 142. Latch 54 maintains the comparator output signal COMPOUT so latched until the next time last digits of operands A and B appear in the pipeline. When MODE signal is a ZERO, latch 54 latches $S_A \oplus \bar{S}_B \oplus S_C$ or $\overline{S_a \oplus S_B \oplus S_C}$ response instead until the next time last digits of operands A and B appear in the pipeline.

Control cell 142 like control cell 141 of FIG. 4 includes a multiplexer 48 and a delay block 34, and the connections of these elements is similar. The CONTROLLSD signal for controlling the operation of multiplexer 48 is obtained, however, by delaying CONTROLMSD for one digit interval using a unit-clock-delay block 56.

FIG. 7 shows an adder subtractor/adder/comparator alternative to that shown in FIG. 5. The cell stack 103 of the FIG. 7 linear combining apparatus uses simpler operation cells 163 in which exclusive-NOR gates 50 do not appear. A control cell 143 similar to control cell 142 of FIG. 4 except for two-input exclusive-OR gate 52 being replaced by a three-input exclusive-NOR gate 58 is included in cell stack 103. Exclusive-NOR gate 58 receives $A_3$, $B_3$ as selectively complemented by XOR gate 44 in operation cell #4, and $C_{MSB}$ as its three input signals. By comparison of truth tables three-input exclusive-NOR gates can be shown to be the logic equivalent of two-input exclusive-OR gate 52 and the particular two-input exclusive-NOR gate 50 that supplies its output response to exclusive-OR gate 52.

FIG. 8 shows another approach to the simplification of the FIG. 5 digital hardware. In the FIG. 8 adder/subtractor/comparator the same control cell 142 is used as in FIG. 5. Hardware reduction is achieved in each of the operation cells 164 included in a cell stack 104 with the control cell 42. This reduction comes about by recognizing that a three-input exclusive-NOR gate 60, which is the equivalent of two-input exclusive-OR gate 44 and two-input exclusive-NOR gate 50, can be utilized to provide a substantial portion of a full adder. A two-input exclusive-NOR gate 62 in cascade with exclusive-NOR gate 60, if MODE signal be ZERO, provides the equivalent logic response $A_i \oplus B_i \oplus C_i$ of the cascade of two XOR gates, one to XOR the input operands, and one to XOR the result with CARRYIN, that are used in the canonic full adder configuration to generate the sum bit output signal. $C_i$ is the CARRYIN bit to the #i operation cell 164, where i=0, 1, 2, 3.

If MODE signal be ZERO, the carry out bit of a full adder is well known to be a ONE if at least two of $A_i$, $B_i$ and $C_i$ are ONEs. If $A_3$ and $B_3$ are both ZEROs exclusive-NOR gate 60 output is a ONE so multiplexer 64 in operation cell #4 selects $A_3$, a ZERO, as its carry out. If only one of $A_3$ and $B_3$ is a ONE, exclusive-NOR gate 60 output is a ZERO, so multiplexer 64 in operation cell #4 selects carry in as carry out. Carry out bit is only ONE if carry in bit is a ONE so two of $A_i$, $B_i$ and $C_i$ are ONEs. If both $A_3$ and $B_3$ are ONEs, exclusive-NOR gate 60 output is a ZERO, so multiplexer 64 in operation cell #4 selects $A_3$, a ONE, as its carry out. Note it is immaterial whether $A_3$ or $B_3$ connects to the input port of multiplexer 64 selected by exclusive-NOR gate 60 output bit being a ZERO.

In these analyses, MODE signal has been assumed to be ZERO, so exclusive-NOR gates 60 operate as two-input gates for $A_i$ and $B_i$. The three-input exclusive-NOR gates 60 are the equivalent logically of an exclusive-OR gate for $B_i$ and MODE supplying input to a two-input exclusive-NOR gate for ($B_i \oplus$MODE) and for $A_i$, it will be appreciated that full adder operation after selective inversion of $B_i$ obtains, whether or not MODE signal be a ONE or a ZERO.

FIG. 9 shows how dual-precision additions may be done with two linear combining apparatuses per FIGS. 4, 5, 7 or 8. The need for dual-precision additions arises, for example, in linearly combining the dual-precision products of two digit-serial multiplier apparatuses (not shown in FIG. 9). In such digit-serial multiplier apparatuses the minor product word, comprising the less significant digits of the full product, completes its arrival in successive digits through a first n-bit-wide pipeline before the major product, comprising the more significant digits of the full product, begins its arrival in successive digits through a second n-bit-wide pipeline.

In FIG. 9 the digit $a_0$ followed by digit $a_1$, both followed by digit $a_2$, all followed by digit $a_3$, together constitute the minor product of a first multiplier apparatus applied as operand A to a linear combiner 66. The digit $b_0$ followed by digit $b_1$, both followed by digit $b_2$, all followed by digit $b_3$, together constitute the minor product of a second multiplier apparatus applied as operand B to linear combiner 66. Linear combiner 66 receives a MODE signal that is a ZERO, conditioning it to function as an adder, and accordingly its CARRYIN signal is also made a ZERO. The CARRYOUT signal from linear combiner 66 is supplied as CARRYIN signal to a further linear combiner 68.

The digit $a_4$ followed by digit $a_5$, both followed by digit $a_6$, all followed by digit $a_7$, together constitute the major product of the first multiplier apparatus and are applied as operand A to the linear combiner 68. The digit $b_4$ followed by digit $b_5$, both followed by digit $b_6$, all followed by digit $b_7$, together constitute the major product of the second multiplier apparatus and are applied as operand B to the linear combiner 68. Linear combiner 68 receives a MODE signal that is a ZERO, conditioning linear combiner 68 to function as an adder, and accordingly its CARRYIN signal is also made a ZERO.

The dual-precision digital sum of the first and second multiplier products appears on two n-bit-wide busses 70 and 72. The initial digits $x_0$, $x_1$, $x_2$ and $x_3$ appear sequentially on bus 70 being supplied from linear combining apparatus 66. Thereafter final digits $x_4$, $x_5$, $x_6$ and $x_7$ appear sequentially on bus 72 being supplied from linear combining apparatus 68.

The FIG. 9 circuitry may be modified to subtract the digit-serial dual-precision products $b_0$, $b_1$, $b_2$, $b_3$, $b_4$, $b_5$, $b_6$, $b_7$ of the second multiplier from the digit-serial dual-precision product $a_0$, $a_1$, $a_2$, $a_3$, $a_4$, $a_5$, $a_6$, $a_7$ of the first multiplier. This modification entails the MODE signals applied to linear combining apparatuses 66 and 68 both being ONEs and the CARRYIN signal supplied to linear combining apparatus 66 being a ONE as well. Similarly, plural-precision comparison can be performed using the same connection as for plural-precision comparison, or modifying those connections by applying a ZERO as CARRYIN signal to linear combining apparatus 66. The FIG. 9 linear combining circuitry may be adapted to perform linear combination on a multiple-precision rather than dual-precision basis using one or more further cell stacks 101, 102, 103 or 104 to supplement cell stacks 66, 68, with the CARRYIN of each supplemental cell stack being supplied by the cell stack handling the next less significant group of digits.

FIG. 10 shows a representative cell stack 105 for shifting digit-serial arithmetic words left by one bit place. (Such shifters are useful for implementing non-restoring division with linear combining apparatuses 102, 103 or 104, as will subsequently be described in connection with FIG. 11). Cell stack 105 has four bit slices fitting it to operate with four-bit-wide digits, but the general architecture of such shifter can be varied to include fewer or more operation cells to accommodate different bit-width digits. Each operation cell 165 of the stack 105 accepts one bit slice $x_0$, $x_1$, $x_2$ or $x_3$ of a digit-serial input signal x with four-bit-wide digits; and each operation cell 165 provides one bit slice $y_0$, $y_1$, $y_2$ or $y_3$ of a digit-serial output signal y from a respective unit-clock-delay block 74 serving as an output latch. The $x_0$ bits are shifted one bit place towards increased significance in operation cells #1 and #2 to be latched into the delay block 74 in operation cell #2 to appear a digit interval later as $y_1$ bits. The $x_1$ bits are shifted one bit place towards increased significance in operation cells #2 and #3 to be latched into the delay block 74 in operation cell #3 to appear a digit interval later as $y_2$ bits. The $x_2$ bits are shifted one bit place towards increased significance in operation cells #3 and #4 to be latched into the delay block 74 in operation cell #3 to appear a digit interval later as $y_3$ bits.

The $x_3$ bits must be processed somewhat differently, since in a one-bit shift left the $y_0$ bit of the initial digit must be a ZERO, and since the $y_0$ bits of the later digits will have to be formed from $x_3$ bits that are delayed by one more digit interval than the $x_0$, $x_1$ and $x_2$ bits forming the $y_1$, $y_2$ and $y_3$ bits. The $x_3$ bit of the final digit is, of course, lost in the one-bit shift left. This different processing of $x_3$ bits is done in the control cell, which may be the same as the 142 or 143 control cell of the linear combining apparatuses of FIGS. 7 or 8, in order to keep smaller the cell library required of the silicon compiler. A cap cell 120 similar to that of these linear combining apparatuses may also be used in cell stack 105. The comparator functions of the control cell 142 or 143 are not used and this portion of the control cell is omitted from FIG. 10. The MODE and CARRYOUT signal ports of the control cell 142 or 143 have no connection to them. Delay block 34 provides the extra digit interval delay to the $x_3$ bits. During the initial digit of the x input signal, multiplexer 48 responds to a CONTROLLSD signal to select a ZERO rather than $x_3$ to the delay block 74 in operation cell #1, providing the one-bit ZERO-fill required in a one-bit shift left. CONTROLLSD signal is generated by delay block 56 responding to a CONTROLMSD signal applied thereto, which latter signal is a ONE only during the most significant bit of X input signal. Since CONTROLMSD is a ZERO during all digits except the last of a word of input signal X, CONTROLLSD signal from delay block 56 is a ONE only during initial digits of input signal x words. Otherwise CONTROLLSD is a ZERO, to select the delayed $x_3$ bit from delay block 34 to the delay block 74 of operation cell #1 to appear a digit interval later as $y_0$ output signal bit.

FIG. 11 shows circuitry for dividing operand A by operand B in a non-restoring division operation that generates a quotient Q having parallel bits $Q_0$, $Q_1$, ... $Q_{(W-1)}$. A respective linear combiner 102, 103 or 104 as described previously is used to generate each of the bits $Q_0$, $Q_1$, ... $Q_{(W-1)}$ of the quotient. The circuitry for generating each bit of Q is separated by dashed line from circuitry for generating another portion or other portions of Q and is labelled by a respective bit number designation relating to Q. Progressing from left to right in FIG. 11, the successive linear combiners 102, 103 or 104 in the chain connection of them help generate successively less significant bits ($Q_{(W-1)}$, $Q_{(W-2)}$ ... $Q_1$, $Q_0$ of the quotient Q. The leftmost of the linear combiners 102, 103 or 104 in FIG. 11 helps generate the most significant bit $Q_{W-1}$ of the quotient Q, receiving operand A as dividend (i.e., as augend or minuend) and operand B as divisor (i.e., as addend or subtrahend). The operands A and B are delayed by a word's length of digit intervals by means not shown in FIG. 11, thereby to temporally align them with sign bits from A and B that are latched for a word interval by means not shown. An exclusive-NOR gate 75 responds to these latched sign bits to generate a response that is applied both as MODE and CARRYIN signals to the leftmost linear combiner 102, 103 or 104 generating $Q_{W-1}$.

Each of the linear combiners 102, 103 or 104, except the rightmost helping generate $Q_0$, supplies its remainder x to a respective one-bit left shifter 105 as previously described in reference to FIG. 10 of the drawing, as its input signal x and the shifted remainder Y is delayed by $(W/n)-2$ additional digit intervals in a respective delay line 76. The delayed shifted remainder is then supplied to the A operand of the one of the linear combiners 102, 103 or 104 generating the next less significant bit of Q. The B operand of each successive one of the linear combiners 102, 103 or 104 is derived from the B operand of its predecessor via a digital delay line 77 having a one-word or $(W/n)$-digit delay. Each of delay lines 76 and 77 comprises a respective cascade connection of unit-clocked-delay elements that is used to compensate for the one word delay in the COMPOUT signals. The COMPOUT signal from each of the linear combiners 102, 103 or 104, is supplied as one of the two input signals to a respective exclusive-OR gate 78 to generate a respective bit $Q_s$ of the quotient where subscript s is 1 , ... $(W-2)$, $(W-1)$ for the W linear combiners as considered from right to left. Each bit of $Q_s$ except $Q_0$ is used as the MODE and CARRYIN signals for the succeeding linear combiner. Each bit $Q_s$ of the quotient is delayed by the number of words equal to its subscript s, by respective ones of additional delay lines 81, 82, 83 etc. to bring all of the bits of quotient Q into temporal alignment with undelayed $Q_0$ at the input ports of a parallel-to-digit-serial converter 84 that converts the quotient Q to digit-serial form.

When W/n is equal to two digits per word, delay lines 76 are replaced by direct connections in a modification of the FIG. 11 divider. No other modifications are necessary. Delay lines 77 each provide two digits of delay. When W/n is equal to one digit per word, each one-bit left shift is simply hard-wired, rather than using cell stack 105, since carry from one digit to the next is no longer required, which hard-wired configuration has no unit-clock-delay associated therewith. The FIG. 11 divider is further modified by replacing delay lines 76 by respective direct connections. The delay lines 77 each become a respective single unit-clocked-delay element.

The division algorithm that the FIG. 11 system and its modifications perform is one wherein the division B is iteratively added with appropriate sign first to the dividend A, and thereafter to the result of the previous signed addition, with that previous result being shifted left to one-bit-place increased significance before the next iteration. The decision as to the sign of the addition, positive or negative, depends directly on the sign of the result of the previous signed addition step—or, in the first addition, this decision depends on the sign of the dividend. The succession of decisions as to sign correspond to the bits of the quotient in non-restoring division, the inventors have discerned. The shifts left of the result of each signed addition creates the same result as the shift right of the divisor after each signed addition step in prior art algorithms for non-restoring division.

Care has to be taken in the division to assure that the magnitude of operand B is larger than the magnitude of operand A. This is done to prevent the quotient from exceeding one, which would result in overranging. It is best, from the standpoint of obtaining best accuracy within the division range capabilities of the system, to scale operands A and B so as to place the binary point of the quotient directly after the sign bit. The quotient can then be re-scaled to relocate the binary point to "correct" position (in a dual-precision format if desired).

Consider now more particularly why the COMPOUT signal provides a correct indication of the sign of the result of a signed addition irrespective of whether there is overflow of the digit-serial linear combining apparatus. In considering the subject of comparison as performed by the FIG. 5 linear combining apparatus it was noted that COMPOUT sign provided a correct indication of the sign of the result of a negative addition or subtraction, irrespective of whether overflow occurred. The following general rule is hypothesized.

$$\text{Sign of } (A+B^*+C_I) = C_0 \oplus S_A \oplus S_B = S_R$$

Here plus sign connotes addition, $B^*$ denotes B or $\bar{B}$, $C_I$ is the carry input to the summation process, and $C_0$ is the carry output from the summation process (i.e. $C_{MSB}$) XNOR denotes the exclusive OR response to $C_0$ and to the truth (ONE) or non-truth (ZERO) of $S_A = S_B$. $S_R$ is the correct sign of the result.

To prove the hypothesis it is noted that, if the two's complement words A, $B^*$ and $C_I$ were extended left by one bit by means of sign bit extension, then there could be no overflow resulting from either their positive addition or their negative addition. That is, since each signal A and $B^*$ extends at most only over half the range of the extended number system, their linear combination can never extend over more than the complete range of the number system. Since there is no possibility for overflow, $S_R$, the correct sign of the result of the linear combination, will invariably appear in the extension bit place of the result. In general, the sum bit response of a full adder is known to be the exclusive-OR of its augend input bit, its addend input bit and its carry input bit. A full adder response in the extension bit place will be the exclusive-OR of the extended sign bit of operand A, the extended sign bit of operand, and $C_{MSB}$ or $C_0$ from the full adder in the sign bit place. Therefore the correct signal of the result $S_R$ is, as hypothesized, $C_0 + S_A + S_B$.

In certain modifications of the system for performing non-restoring division as thusfar described XOR gates 78 can be dispensed and the $Q_s$ bits can be derived directly from the COMPOUT signals of the linear combiners. In a first such modification divisor B is restricted to never being negative and the latched sign bit of A is used directly as the MODE and CARRYIN signals for the linear combiner leftmost in FIG. 11. This permits XNOR gate 75 and the XOR gates 78 to be dispensed with. In a second modification, the system for performing non-restoring division as first modified is preceded by circuitry that selectively complements both operands A and B as supplied to the system, performing the complementations if and only if the latched sign bit of B is a ONE.

A third modification wherein XOR gates 78 are dispensed with retains XNOR gate 75 connected as shown in FIG. 11. The control cell 142 or 143 in each linear combiner is modified for selectively complementing input signal to latch 54 responsive to the latched sign bit of operand B being a ONE. This apparatus may be an additional XOR gate, responsive to $S_B$ and the non-complemented input signal to latch 54, for supplying the selectively complemented input signal to latch 54.

FIG. 12 shows the nature of the parallel-to-digit-serial converter 84, supposing word length W is sixteen bits and digit width n is four bits. The sixteen bits of Q are segregated into four spatial phasings according to the bit position they will assume in the digit-serial format. $Q_0$, $Q_4$, $Q_8$ and $Q_{12}$ are loaded in parallel into a first parallel-in/serial-out register 86, responsive to a LOAD COMMAND signal, applied just prior to the least significant digit of the quotient being clocked out in digital serial format. $Q_1$, $Q_5$, $Q_9$ and $Q_{13}$ are, responsive to LOAD COMMAND signal, loaded in parallel into a second parallel-in/serial-out register 88 at the same time register 86 is loaded. $Q_2$, $Q_6$, $Q_{10}$ and $Q_{14}$ are, responsive to LOAD COMMAND signal, loaded in parallel into a third parallel-in/serial-out register 90 at the same time registers 86 and 88 are loaded. $Q_3$, $Q_7$, $Q_{11}$ and $Q_{15}$ are, responsive to LOAD COMMAND signal, loaded in parallel into a fourth parallel-in/serial-out register 92 at the same time registers 86, 88 and 90 are loaded. Parallel-in/serial-out registers 86, 88, 90 and 92 are sometimes referred to as "side-loaded shift registers" in the literature. After being parallelly loaded, registers 86, 88, 90 and 92 have their contents shifted out at digit clock rate to supply respective ones of the bit streams of the digit-serial quotient Q.

FIG. 13 is the actual stylized layout diagram supplied to integrated-circuit technicians who designed the mask set for operation cell 164 of FIG. 8, which cell 164 is identified as ASUBSLICE1 in FIG. 13. The layout diagrams of FIGS. 13 and 14 use control signals supplied in both complemented and non-complemented form because complementary-metal-oxide-semiconductor (CMOS) circuits, which are familiar to those skilled in the art, are utilized. Lines M and MB crossing operation cell 164 convey the MODE signal and its complement respectively. $V_{SS}$ and $V_{DD}$ operating voltage lines also cross the operation cell. Lines C0 and C1 convey the carry in and carry out bits to the operation cell. Lines A and B receive the A and B operands, respectively. Line CR is the carry return line 21 of FIG. 8 moved in position within the operation cell.

Multiplexers AS019 and AS020 and inverters AS011, AS014, AS015 and AS016 together provide an exclusive-OR gate for operand A supplied on line A, operand B supplied on line B, and MODE signal supplied in complementary forms on lines M and MB. An inverter AS009 complements the XOR gate response to appear on line EQ as an exclusive-NOR response to A, B and MODE signals; and a further inverter AS008 complements the exclusive-NOR response to appear as exclusive-OR response on line NEQ.

A multiplexer AS021 corresponds to multiplexer 64 of FIG. 8 except for selecting between the complements of A operand and carry-in signals rather than the signals themselves. A operand is complemented by an inverter AS017, and carry-in signal arriving on line CI is complemented by an inverter AS013. Multiplexer AS021 response is inverted by an inverter AS010 thereafter, so either A or carry-in signal is applied to C0 line as carry-out signal responsive to multiplexer AS021 selection.

A multiplexer AS022 selects, either the complement of carry input signal as supplied by inverter AS013, or the carry input signal developed by again complementating in a further inverter AS018, which selection is controlled by signals appearing in complemented form on lines EQ and NEQ. These connections cause multiplexer AS022 to function as XOR gate 62. AS012 is the clocked-unit delay latch 32 of FIG. 8. It receives first and second phases of clocking signal on lines C1 and C2, respectively; and their complements on lines C1B and C2B respectively.

FIG. 14 is the actual stylized layout diagram for a control cell ASUBCONT, corresponding substantially to control cell 142 as shown in FIG. 8 (or 5), as supplied to integrated circuit technicians. An inverter AS09 complements the signal received at MODE input connection to supply line MB running to the operation cells ASUBSLICE1, and a further inverter AS08 regenerates the MODE signal by complementing its complement to supply line M running to operation cells ASUBSLICE1.

Responsive to clock signal of a first phase supplied via CLOCK 1 bus, cascaded inverters AS04 and AS07 respectively generate the complement of that clock signal on line C1B and regenerate that clock signal on line C1. Responsive to clock signal of a second phase supplied via CLOCK 2 bus, cascaded inverters AS05 and AS06 respectively generate the complement of that clock signal on line C2B and regenerate that clock signal on line C2. Lines C1, C1B, C2 and C2B connect to extensions of these lines in the ASUBSLICE1 operation cells in stack with ASUBCONT control cell.

The clock signals on lines C1, C1B, C2 and C2B are utilized by the unit-clock-delay element AS01, corresponding to delay block 34 in FIG. 8, which element AS01 delays the carry-out signal from the last operation cell as supplied on the carry-in line CI of ASUBCONT control cell. The clock signals on lines C1, C1B, C2 and C2B are also utilized by the unit-clock-delay latch element AS02, corresponding to latch 54 of FIG. 8, which element AS02 supplies a latch output signal GELT that is either the equivalent of COMPOUT signal of FIG. 8 or its one's complement.

Connection CONTROL of ASUBCONT corresponds to connection CONTROLMSD of control cell 142. The CONTROL MSD signal applied thereto is complemented by an inverter AS19 to drive line CONTB and is then re-complemented by an inverter AS18 to drive line CONT. The signals CONT and CONTB lines control the loading of latch element AS02, just as signal on CONTROL MSD line controls latch 54 in FIG. 8.

Inverters AS03 and AS10 are connected with a multiplexer AS13 to provide an XOR gate in ASUBCONT cell that corresponds to XOR gate 52 in control cell 142 of FIG. 8. This XOR gate responds to carry-in supplied via connection cI from the adjoining bit-slice operation cell ASUBSLICE1 and to the signal supplied in non-complemented and complemented form via lines EQ and NEQ to XOR the carry-in and EQ-line signals on line LT. An inverter AS11 complements the signal on line LT on line GE. One of these signals is applied (by one of two optional interconnection patterns) to the RIN line to be latched by latch element AS02 to be supplied on output connections GELT.

A multiplexer AS12 in ASUBCONT cell corresponds to multiplexer 48 in the FIG. 8 control cell 142. The output signal from multiplexer AS12 is buffered by the cascaded inverter AS17 and AS00 to drive carry return line CR. Delay block 56 of control cell 142 finds no correspondence within ASUBCONT cell itself, the multiplexer AS12 being controlled by CONTROLLSB signal as complemented by an inverter AS16 and complemented again by an inverter AS15. Delay block 56 is inserted outside ASUBCONT cell automatically by the silicon compiler making an actual circuit design, as part of its programming to generate proper system timing. Multiplexer AS12 selects either delayed carry-in from delay element AS01 or a forced carry-in CARRYLOW as twice-complemented by cascaded inverter amplifiers AS14 and AS20.

While only certain preferred features of the invention have been herein described and illustrated, many modifications and changes will occur to those skilled in the art and acquainted with the foregoing disclosure. It is, therefore, to be understood that the appended claims are intended to cover all such modifications and changes as fall within the true spirit of the invention.

What is claimed is:

1. Linear combining apparatus for digit-serial first and second operands each having words of W bits simultaneously supplied during respective clock intervals as successive W/n digits of n bits apiece in an efficient arithmetic, n being a plural integer and W being a multiple at least two of n, the less significant digits of each word preceding the more significant digits, the sign bit if any of each word included in its most significant digit, the bits of each digit being respectively identified by consecutive ordinal numbers first through $n^{th}$ in order of their increasing significance, said linear combining apparatus comprising:

a plurality n in number of full adders respectively identified by consecutive ordinal numbers first through $n^{th}$, each full adder having a respective augend input port for receiving the bits of said first operand digits identified by the same ordinal number as that full adder, each full adder having a respective addend input port for receiving the bits of said second operand digits identified by the same ordinal number as that full adder, each full adder having a carry input port and a sum output port and a carry output port, the carry output port of each of said plurality of full adders except the $n^{th}$ being connected to the carry input port of the one of said plurality of full adders that is identified by the next higher ordinal number;

means for supplying a digit-serial output signal responsive to the bits supplied at the sum output ports of said first through $n^{th}$ full adders;

selection apparatus for selecting a forced carry bit to the carry input port of said first full adder during the first digits of words of said first and second operands and for otherwise selecting the bit supplied at the carry output port of said $n^{th}$ full adder as delayed by one clock interval to the carry input port of said first full adder;

a (n+1)th unit-clock-delay element included in said selection apparatus, having an input port to which the carry output port of said $n^{th}$ full adder connects, and having an output port; and a multiplexer included in said selection apparatus, having a first input port connected to the output port of said first unit-clock-delay element, having a second input port connected for receiving said forced carry bit, having an output port connected to the carry input port of said first full adder, responding to a control signal being in a first state thereof during all digits of said digit-serial operands except the first digits to select the bit supplied to its first input port to its output port, and responding to said control signal being in a second state thereof during only the first digits of said digit-serial operands to select the forced carry bit supplied to its second input port to its output port; and selective complementing apparatus for generating said second operands as the equals of or as the one's complements of third digit-serial operands, depending on whether a mode signal is a ZERO or is a ONE, in which said linear combining apparatus said mode signal is applied to the second input port of said multiplexer to cause said linear combining apparatus to be operative as an adder when said mode signal is a ZERO and to be operative as a subtractor when said mode signal is a ONE.

2. Linear combining apparatus as set forth in claim 1 wherein n is an integer at least three.

3. Linear combining apparatus as set forth in claim 2 wherein said means for supplying a digit-serial output signal responsive to the bits supplied at the sum output ports of said first through nth full adders comprises:

a plurality n in number of unit-clock-delay elements identified by respective consecutive ordinal numbers first through $n^{th}$, each said unit-clock-delay element having an input port connected to the sum output port of the full adder identified by corresponding ordinal number and having an output port, whereby respective bits of each digit of said digit-serial output signal are supplied at the output ports of said first through $n^{th}$ unit-clock-delay elements.

4. Linear combining apparatus for digit-serial first and second operands each having words of W bits simultaneously supplied during respective clock intervals as successive W/n digits of n bits apiece in an efficient arithmetic, n being a plural integer and W being a multiple at least two of n, wherein words of said first and second digit-serial operands are two's complement binary numbers having respective sign bits as their respective most significant bits, the relatively less significant digits of each word preceding the relatively more significant digits, the sign bit of each word being included in its most significant digit, the bits of each digit being respectively identified by consecutive ordinal numbers first through $n^{th}$ in order of their increasing significance; said linear combining apparatus comprising:

a plurality n in number of full adders respectively identified by consecutive ordinal numbers first through $n^{th}$, each full adder having a respective augend input port for receiving the bits of said first operand digits identified by the same ordinal number as that full adder, each full adder having a respective addend input port for receiving the bits of said second operand digits identified by the same ordinal number as that full adder, each full adder having a carry input port and a sum output port and a carry output port, the carry output port of each of said plurality of full adders except the nth being connected to the carry input port of the one of said plurality of full adders that is identified by the next higher ordinal number;

selection apparatus for selecting a forced carry bit to the carry input port of said first full adder during the first digits of words of said first and second operands and for otherwise selecting the bit supplied at the carry output port of said $n^{th}$ full adder as delayed by one clock interval to the carry input port of said first full adder;

selective complementing apparatus for generating said second operands as the equals of or as the one's complements of third digit-serial operands, depending on whether a mode signal is a ZERO or is a ONE;

means for supplying a digit-serial output signal responsive to the bits supplied at the sum output ports of said first through nth full adders;

a two-input exclusive-NOR gate having a first input port to which the sign bit of said first operand is applied, having a second input port to which the sign bit of said second operand is applied, and having an output port;

a two-input exclusive-OR gate having a first input port to which the output port of said two-input exclusive-NOR gate connects, having a second input port to which the carry output port of said $n^{th}$ full adder connects, and having an output port; and a digital latch for storing response to the signal supplied from the output port of said two-input exclusive-OR gate during the last digit of each word of said first operand, each said response indicating how said digit-serial first and second operands compare with each other and being stored for the duration of the next word of said first operand.

5. A plurality of linear combining apparatuses, each as set forth in claim 4 connected in a chain, to form a system for dividing said first operands by respective ones of said third operands, which chain further comprises before each linear combining apparatus except the first in said chain;

a respective digit-serial shifter for shifting said digit-serial output signal of the preceding linear combining apparatus one bit place towards greater significance and discarding that bit in the most significant bit place before shift occurred;

a respective delay line for augmenting the delay of the shift results so they are W/n digit intervals later than the first and second operands received by the preceding linear combining apparatus, which delayed shift results are then applied as third operand to the linear combining apparatus next after said preceding linear combining apparatus in said chain; and a respective further delay line for delaying the third operand as applied to each preceding linear combining apparatus by W/n digit intervals for application to the next succeeding linear combining apparatus in said chain;

means for deriving successive bits of the quotient from respective ones of the bits successively supplied from said digital latches;

means for applying each successive bit of the quotient as a mode signal to any next succeeding linear combining apparatus in said chain; and means for applying a mode signal to the initial linear combining apparatus in said chain that is at least in effect an exclusive-NOR response to the sign bits of the first operand being divided and the third operand dividing that first operand.

6. A system for dividing as set forth in claim 5 further including:

a differential delay network for providing parallel-in-time responses to the respective bits of the quotient.

7. A system for dividing as set forth in claim 6 still further including:

a parallel-to-digit-serial converter for converting said parallel-in-time responses to the respective bits of the quotient to a digit-serial representation of said quotient.

8. Linear combining apparatus as set forth in claim 4 wherein n is an integer at least three.

9. Linear combining apparatus as set forth in claim 8 wherein said selection apparatus comprises:

a $(n+1)^{th}$ unit-clock-delay element, having an input port to which the carry output port of said $n^{th}$ full adder connects, and having an output port; and a multiplexer having a first input port connected to the output port of said first unit-clock-delay element, having a second input port connected for receiving said forced carry bit, having an output port connected to the carry input port of said first full adder, responding to a control signal being in a first state thereof during all digits of said digit-serial operands except the first digits to select the bit supplied to its first input port to its output port, and responding to said control signal being in a second state thereof during only the first digits of said digit-serial operands to select the forced carry bit supplied to its second input port to its output port.

10. Linear combining apparatus as set forth in claim 9 wherein said means for supplying a digit-serial output signal responsive to the bits supplied at the sum output ports of said first through $n^{th}$ full adders comprises:

a plurality n in number of unit-clock-delay elements identified by respective consecutive ordinal numbers first through $n^{th}$, each said unit-clock-delay element having an input port connected to the sum output port of the full adder identified by corresponding ordinal number and having an output port, whereby respective bits of each digit of said digit-serial output signal are supplied at the output ports of said first through $n^{th}$ unit-clock-delay elements.

11. Linear combining apparatus for digit-serial first and second operands each having words of W bits simultaneously supplied during respective clock intervals as successive W/n digits of n bits apiece in an efficient arithmetic, n being a plural integer and W being a multiple at least two or n, wherein words of said first and second digit-serial operands are two's complement binary numbers having respective sign bits as their respective most significant bits, the relatively less significant digits of each word preceding the relatively more significant digits, the sign bit of each word being included in its most significant digit, the bits of each digit being respectively identified by consecutive ordinal numbers first through $n^{th}$ in order of their increasing significance; said linear combining apparatus comprising:

a plurality n in number of full adders respectively identified by consecutive ordinal numbers first through $n^{th}$, each full adder having a respective augend input port for receiving the bits of said first operand digits identified by the same ordinal number as that full adder, each full adder having a respective addend input port for receiving the bits of said second operand digits identified by the same ordinal number as that full adder, each full adder having a carry input port and a sum output port and a carry output port, the carry output port of each of said plurality of full adders except the $n^{th}$ being connected to the carry input port of the one of said plurality of full adders that is identified by the next higher ordinal number;

selection apparatus for selecting a forced carry bit to the carry input port of said first full adder during the first digits of words of said first and second operands and for otherwise selecting the bit supplied at the carry output port of said $n^{th}$ full adder as delayed by one clock interval to the carry input port of said first full adder;

selective complementing apparatus for generating said second operands as the equals of or as the one's complements of third digit-serial operands, depending on whether a mode signal is a ZERO or is a ONE;

means for supplying a digit-serial output signal responsive to the bits supplied at the sum output ports of said first through $n^{th}$ full adders;

a three-input exclusive-NOR gate having a first input port to which the sign bit of said first operand is applied, having a second input port to which the sign bit of said second operand is applied, having a third output to which the carry output port of said $n^{th}$ full adder connects, and having an output port; and a digital latch for storing response to the signal supplied from the output port of said exclusive-NOR gate during the last digit of each word of said first operand, each said response indicating how said digit-serial first and second operands compare with each other and being stored for the duration of the next word of said first operand.

12. A plurality of linear combining apparatuses, each as set forth in claim 11, connected in a chain to form a system for dividing said first operands by respective ones of said third operands, which chain further comprises before each linear combining apparatus except the first in said chain:

a respective digit-serial shifter for shifting said digit-serial output signal of the preceding linear combining apparatus one bit place towards greater significance and discarding that bit in the most significant bit place before shift occurred;

a respective delay line for augmenting the delay of the shift results so they are W/n digit intervals later than the first and second operands received by the preceding linear combining apparatus, which delayed shift results are then applied as third operand to the linear combining apparatus next after said preceding linear combining apparatus in said chain; and a respective further delay line for delaying the third operand as applied to each preceding linear combining apparatus by W/n digit intervals for application to the next succeeding linear combining apparatus in said chain;

means for deriving successive bits of the quotient from respective ones of the bits successively supplied from said digital latches;

means for applying each successive bit of the quotient as a mode signal to any next succeeding linear combining approaches in said chain; and means for applying a mode signal to the initial linear combining apparatus in said chain that is at least in effect an exclusive-NOR response to the sign bits of the first operand being divided and the third operand and dividing that first operand.

13. A system for dividing as set forth in claim 12 further including:

a differential delay network for providing parallel-in-time responses to the respective bits of the quotient.

14. A system for dividing as set forth in claim 13 still further comprising:

a parallel-to-digit-serial converter for converting said parallel-in-time responses to the respective bits of the quotient to a digit-serial representation of said quotient.

15. Linear combining apparatus as set forth in claim 11 wherein n is an integer at least three.

16. Linear combining apparatus as set forth in claim 15 wherein said selection apparatus comprises:

a $(n+1)^{th}$ unit-clock-delay element, having an input port to which the carry output port of said $n^{th}$ full adder connects, and having an output port; and a multiplexer having a first input port connected to the output port of said first unit-clock-delay element, having a second input port connected for receiving said forced carry bit, having an output port connected to the carry input port of said first full adder, responding to a control signal being in a first state thereof during all digits of said digit-serial operands except the first digits to select the bit supplied to its first input port to its output port, and responding to said control signal being in a second state thereof during only the first digits of said digit-serial operands to select the forced carry bit supplied to its second input port to its output port.

17. Linear combining apparatus as set forth in claim 16 wherein said means for supplying a digit-serial output signal responsive to the bits supplied at the sum output ports of said first through $n^{th}$ full adders comprises:

a plurality n in number of unit-clock-delay elements identified by respective consecutive ordinal numbers first through $n^{th}$, each said unit-clock-delay element having an input port connected to the sum output port of the full adder identified by corresponding ordinal number and having an output port, whereby respective bits of each digit of said digit-serial output signal are supplied at the output ports of said first through $n^{th}$ unit-clock-delay elements.

18. Linear combining apparatus for paired digit-serial operands, words of which each comprise W/n successively supplied digits of n bits apiece, successively supplied in order of increasing significance in respective successive clock intervals, n and W/n being plural integers, the n bits of each digit of said paired operands being identified herein by consecutive ordinal numbers first through $n^{th}$ assigned in order of increasing significance, said linear combining apparatus comprising:

n full adders respectively identified by consecutive ordinal numbers first through $n^{th}$, each of said adders having a respective augend input port, a respective addend input port, a respective carry input port, a respective sum output port, and a respective carry output port;

means for applying to the augend input ports of said first through $n^{th}$ full adders the bits of the first of said paired operands that are identified by corresponding ordinal numbers;

means for applying to the addend input ports of said first through $n^{th}$ full adders the bits of the second of said paired operands that are identified by corresponding ordinal numbers;

means for continuously applying bits from the carry output port of each of said first through $(n-1)^{th}$ full adders to the carry input port of said full adder that is identified by an ordinal number one higher;

a two-input AND gate having a first input port to which successive bits from the carry output of said $n^{th}$ full adder are applied, having a second input port to which a signal that is a logic ZERO during the final digit of each word of said paired operands and that is otherwise a logic ONE is applied, and having an output port at which the AND gate response is provided;

means for applying said AND gate response after a one-clock-interval delay to the carry input port of said first full adder; and means for supplying digit-serial output signal responsive to the sum bits supplied at said sum output ports of said first through $n^{th}$ full adders.

19. Linear combining apparatus for performing signed additions of first and second digit-serial operands, wherein words of said first and second digit-serial operands each comprise W/n successively supplied digits of n bits apiece, successively supplied in order of increasing significance in respective successive clock intervals, n and W/n being plural integers, the n bits of each digit of said first and second digit-serial operands being identified herein by consecutive ordinal numbers first through $n^{th}$ assigned in order of increasing significance, and wherein words of said first and second digit-serial operands are two's complementary binary numbers each including in its last digit a sign bit as the most significant bit therein, said linear combining apparatus comprising:

n full adders respectively identified by consecutive ordinal numbers first through $n^{th}$, each of said adders having a respective augend input port, a respective addend input port, a respective carry input port, a respective sum output port, and a respective carry output port;

means for applying to the augend input ports of said first through $n^{th}$ adders which bits correspond to the bits of the first of said paired operands that are identified by corresponding ordinal numbers;

means for applying bits to the addend input ports of said first through $n^{th}$ adders which bits correspond to the bits of the second of said paired operands that are identified by corresponding ordinal numbers;

means for continuously applying bits from the carry output port of each of said first through $(n-1)^{th}$ full adders to the carry input port of said full adder that is identified by an ordinal number one higher;

means for selectively applying bits from the carry output port of said $n^{th}$ adder, as delayed in one clock interval, to the carry input port of said first full adder during each clock interval except that in which the first digits of each word of said paired digit-serial operands are supplied; and means for supplying digit-serial output signal responsive to the sum bits supplied at said sum output ports of said first through $n^{th}$ full adders, said linear combining apparatus including within each said full adder:

a respective three-input exclusive-NOR gate identified by the same ordinal number as the full adder in which it is included, having a first input port for receiving a mode signal that is a ZERO during positive addition and that is a ONE during negative addition or subtraction, having a second input port that is a one of said augend input ports and is for receiving the bit of said first operand identified by the same ordinal number as the full adder which includes that exclusive-NOR gate, having a third input port that is one of said addend input ports and is for receiving the bit of said second operand that is identified by the same ordinal number as the full adder which includes that exclusive-NOR gate, and having an output port;

a respective two-input exclusive-OR gate identified by the same ordinal number as the full adder in which it is included, having a first input port to which the output port of the exclusive-NOR gate identified by the same ordinal number connects, having a second input port which is the carry input port of that same said full adder, and having an output port which is the sum output port of that same said full adder; and a respective multiplexer identified by the same ordinal number as the full adder in which it is included, for selecting its output signal to the carry output port of that same said full adder responsive to a respective control signal therefor supplied to it from the output port of the exclusive-NOR gate identified by the same ordinal number as it is, said multiplexer responding to its control signal being a ZERO to select as its output signal the bit at the carry-input port of the full adder in which it is included, and said multiplexer responding to its control signal being a ONE to select as its output signal the bit at one of the second and third input ports of the exclusive-NOR gate identified by the same ordinal number as that multiplexer.

20. Linear combining apparatus as set forth in claim 19 including:

an $(n+1)^{th}$ exclusive-OR gate having a first input port to which the output port of said $n^{th}$ exclusive-NOR gate connects, having a second input port to which the carry output port of said $n^{th}$ full adder connects, and having an output port for supplying a result of a comparison of said first and second operands.

21. Linear combining apparatus as set forth in claim 20 including a latch for latching a response to the bit appearing at the output port of said $(n+1)^{th}$ exclusive-OR gate during the final digits of said first and second operands until their next final digits.

22. Linear combining apparatus as set forth in claim 21 wherein said means for generating a digit-serial output signal from the sum bits supplied at the sum output ports of said first through $n^{th}$ full adders comprises:

a plurality n in number of unit-clock-delay elements identified by respective consecutive ordinal numbers first through $n^{th}$, each said unit-clock-delay element having an input port connected to the sum output port of the full adder identified by the same ordinal number as it is and having an output port, so that respective bits of each digit of said digit-serial output signal are supplied at the output ports of said first through $n^{th}$ unit-clock-delay elements.

23. Linear combining apparatus as set forth in claim 22 wherein said selection apparatus comprises:

an $(n+1)^{th}$ unit-clock-delay element, having an input port to which the carry output port of said $n^{th}$ full adder connects, and having an output port; and an $(n+1)^{th}$ multiplexer having a first input port connected to the output port of said first unit-clock-delay element, having a second input port connected for receiving said forced carry bit, having an output port connected to the carry input port of said first full adder, responding to a control signal being in a first state thereof during all digits of said digit-serial operands except their first digits to select the bit supplied to its first input port to its output port, and responding to said control signal being a second state thereof during first digits of said digit-serial operands to select the forced carry bit supplied to its second input port to its output port, said mode signal being used as said forced carry bit.

24. Linear combining apparatus as set forth in claim 23 including means for applying said mode signal to the second input port of said $(n+1)^{th}$ multiplexer.

25. A plurality of linear combining apparatus as set forth in claim 23 connected in a chain within a system for dividing said first operands by respective ones of said third operands, which chain further comprises before each linear combining apparatus except the first in said chain:
   a respective digit-serial shifter for shifting said digit-serial output signal of the preceding linear combining apparatus one bit place towards greater significance and discarding that bit in the most significant bit place before shift occurred;
   a respective delay line for augmenting the delay of the shift results so they are W/n digit intervals later than the first and second operands received by the preceding linear combining apparatus, which delayed shift results are then applied as third operand to the linear combining apparatus next after said preceding linear combining apparatus in said chain; and
   a respective further delay line for delaying the third operand as applied to each preceding linear combining apparatus by W/n digit intervals for application to the next succeeding linear combining apparatus in said chain;
   means for deriving successive bits of the quotient from respective ones of the bits successively supplied from said digital latches;
   means for applying each successive bit of the quotient as a mode signal to any next succeeding linear combining apparatus in said chain; and
   means for applying a mode signal to the initial linear combining apparatus in said chain that is at least in effect an exclusive-NOR response to the sign bits of the first operand being divided and the third operand dividing that first operand.

26. A system for dividing as set forth in claim 25 further including:
   a differential delay network for providing parallel-in-time response to the respective bits of the quotient.

27. A system for dividing as set forth in claim 26 still further including:
   a parallel-to-digit serial converter for converting said parallel-in-time responses to the respective bits of the quotient to a digit-serial representation of said quotient.

28. Linear combining apparatus as set forth in claim 19 including:
   an $(n+1)^{th}$ exclusive-OR gate having a first input port to which the output port of said $n^{th}$ exclusive-NOR gate connects, having a second input port to which the carry output port of said $n^{th}$ full adder connects, and having an output port for supplying a result of a comparison of said first and second operands.

29. Linear combining apparatus as set forth in claim 28 including a latch for latching the bit appearing at the output port of said $(n+1)^{th}$ exclusive-NOR gate during the final digits of said first and second operands until their next final digits.

30. Linear combining apparatus as set forth in claim 29 wherein said means for supplying a digit-serial output signal responsive to the bits supplied at the sum output ports of said first through $n^{th}$ full adders comprises:
   a plurality n in number of unit-clock-delay elements identified by respective consecutive ordinal number first through $n^{th}$, each said unit-clock-delay element having an input port connected to the sum output port of the full adder identified by the same ordinal number as it is and having an output port, so that respective bits of each digit of said digit-serial output signal are supplied at the output ports of said first through $n^{th}$ unit-clock-delay elements.

31. Linear combining apparatus as set forth in claim 30 wherein said selection apparatus comprises:
   an $(n+1)^{th}$ unit-clock-delay element, having an input port to which the carry output port of said $n^{th}$ full adder connects, and having an output port; and
   an $(n+1)^{th}$ multiplexer having a first input port connected to the output port of said first unit-clock-delay element, having a second input port connected for receiving said forced carry bit, having an output port connected to the carry input port of said first full adder, responding to a control signal being in a first state thereof during all digits of said digit-serial operands except their first digits to select the bit supplied to its first input port to its output port, and responding to said control signal being a second state thereof during only the first digits of said digit-serial operands to select the forced carry bit supplied to its second input port to its output port, said mode signal being used as said forced carry bit.

32. Linear combining apparatus as set forth in claim 31 including means for applying said mode signal to the second input port of said $(n+1)^{th}$ multiplexer.

33. A plurality of linear combining apparatus as set forth in claim 31 connected in a chain within a system for dividing said first operands by respective ones of said third operands, which chain further comprises before each linear combining apparatus except the first in said chain:
   a respective digit-serial shifter for shifting said digit-serial output signal of the preceding linear combining apparatus one bit place towards greater significance and discarding that bit in the most significant bit place before shift occurred;
   a respective delay line for augmenting the delay of the shift results so they are W/n digit intervals later than the first and second operands received by the preceding linear combining apparatus, which delayed shift results are then applied as third operand to the linear combining apparatus next after said preceding linear combining apparatus in said chain; and
   a respective further delay line for delaying the third operand as applied to each preceding linear combining apparatus by W/n digit intervals for application to the next succeeding linear combining apparatus in said chain;
   means for deriving successive bits of the quotient from respective ones of the bits successively supplied from said digital latches;
   means for applying each successive bit of the quotient as a mode signal to any next succeeding linear combining apparatus in said chain; and
   means for applying a mode signal to the initial linear combining apparatus in said chain that is at least in effect an exclusive-NOR response to the sign bits of the first operand being divided and the third operand dividing that first operand.

34. A system for dividing as set forth in claim 33 further including:
a differential delay network for providing parallel-in-time responses to the respective bits of the quotient.

35. A system for dividing as set forth in claim 34 still further including:
a parallel-to-digit serial converter for converting said parallel-in-time responses to the respective bits of the quotient to a digit-serial representation of said quotient.

36. Linear combining apparatus for concurrent first and second digit-serial operands, words of which paired operands each comprise W/n successively supplied digits of n bits apiece, successively supplied in order of increasing significance in respective successive clock intervals, n and W/n being plural integers, the n bits of each digit of said paired operands being identified by consecutive ordinal numbers first through $n^{th}$ assigned in order of increasing significance, said linear combining apparatus comprising:
n two-input exclusive-OR gates identified by respective consecutive ordinal numbers first through $n^{th}$, having respective first input ports receptive of bits of said second operand identified by ordinal numbers corresponding to those identifying them, having respective second input ports receptive of a mode signal, and having respective output ports;
n full adders identified by respective consecutive ordinal numbers first through $n^{th}$, having respective carry input ports, having respective augend input ports receptive of bits of said first operand identified by ordinal numbers corresponding to those identifying the adders, having respective addend input ports respectively connected from the output ports of said n two-input exclusive-OR gates identified by ordinal numbers corresponding to those identifying the adders, having respective sum output ports and having respective carry output ports, the carry output ports of each of said full adders except the $n^{th}$ being connected to the carry input port of the one of said full adders identified by the next higher ordinal number;
means for delaying bits supplied from the carry output port of said $n^{th}$ full adder until the next clock cycle, to provide a delayed carry bit;
a multiplexer responding to a control signal applied thereto being in a first state to select said delayed carry bit to the carry input port of said first full adder and being in a second state to select a forced carry bit to the carry input port of said first full adder;
means for supplying a digit-serial output signal responsive to the bits supplied at the sum output ports of said first through $n^{th}$ full adders;
a two-input exclusive-NOR gate having a first input port for receiving the $n^{th}$ bit of digits of said first operand, having a second input port connected from the output port of said $n^{th}$ exclusive-OR gate, and having an output port;
a further, $(n+1)^{th}$ exclusive-OR gate having a first input port to which the output port of said exclusive-NOR gate connects, having a second input port to which the carry output port of said $n^{th}$ full adder connects, and having an output port; and
a single-bit latch responding to the second state of said control signal for latching a response to the bit at the output port of said $(n+1)^{th}$ exclusive-OR gate, which latched bit represents the result of comparing said concurrent first and second digit-serial operands.

37. Linear combining apparatus as set forth in claim 36 wherein said forced carry bit is a ZERO.

38. Linear combining apparatus as set forth in claim 36 wherein said forced carry bit is a ONE.

39. Linear combining apparatus as set forth in claim 36 wherein said means for supplying a digit-serial output signal response to the bits supplied at the sum output ports of said first through $n^{th}$ full adders comprises:
respective means for delaying each of the bits supplied at the sum output ports of said first through $n^{th}$ adders until the next output cycle to generate said digit-serial output signal.

40. A plurality of linear combining apparatus as set forth in claim 39 connected in a chain within a system for dividing said first operands by respective ones of said third operands, which chain further comprises before each linear combining apparatus except the first in said chain:
a respective digit-serial shifter for shifting said digit-serial output signal of the preceding linear combining apparatus one bit place towards greater significance and discarding that bit in the most significant bit place before shift occurred;
a respective delay line for augmenting the delay of the shift results so they are W/n digit intervals later than the first and second operands received by the preceding linear combining apparatus, which delayed shift results are then applied as third operand to the linear combining apparatus next after said preceding linear combining apparatus in said chain; and
a respective further delay line for delaying the third operand as applied to each preceding linear combining apparatus by W/n digit intervals for application to the next succeeding linear combining apparatus in said chain, so that respective bits of the quotient are successively supplied from said digital latches.

41. A system for dividing as set forth in claim 40 further including:
a differential delay network for providing parallel-in-time responses to the respective bits of the quotient.

42. A system for dividing as set forth in claim 41 still further including:
a parallel-to-digit serial converter for converting said parallel-in-time responses to the respective bits of the quotient to a digit-serial representation of said quotient.

43. Linear combining apparatus for concurrent first and second digit-serial operands, words of which paired operands each comprise W/n successively supplied digits of n bits apiece, successively supplied in order of increasing significance in respective successive clock intervals, n and W/n being plural integers, the n bits of each digit of said paired operands being identified by consecutive ordinal numbers first through $n^{th}$ assigned in order of increasing significance, said linear combining apparatus comprising:
n two-input exclusive-OR gates identified by respective consecutive ordinal numbers first through $n^{th}$, having respective first input ports receptive of bits of said second operand identified by ordinal numbers corresponding to those identifying the adders, having respective second input ports receptive of a mode signal, and having respective output ports;

n full adders identified by respective consecutive ordinal numbers first through $n^{th}$, having respective carry input ports, having respective augend input ports receptive of bits of said first operand identified by ordinal numbers corresponding to those identifying the adders, having respective addend input ports respectively connected from the output ports of said n two-input exclusive-OR gates identified by ordinal numbers corresponding to those identifying the adders, having respective sum output ports and having respective carry output ports, the carry output ports of each of said full adders except the $n^{th}$ being connected to the carry input port of the one of said full adders identified by the next higher ordinal number;

means for delaying bits supplied from the carry output port of said $n^{th}$ full adder until the next clock cycle, to provide a delayed carry bit;

a multiplexer responding to a control signal applied thereto being in a first state to select said delayed carry bit to the carry input port of said first full adder and being in a second state to select a forced carry bit to the carry input port of said first full adder;

means for supplying a digit-serial output signal responsive to the bits supplied at the sum output ports of said first through $n^{th}$ full adders;

a three-input exclusive-NOR gate having a first input port connected to receive the $n^{th}$ bits of the digits of said first operands, having a second input port to which the output port of said $n^{th}$ exclusive-OR gate connects, having a third input port to which the carry output port of said $n^{th}$ full adder connects, and having an output port; and a single-bit latch responding to the second state of said control signal for latching a response to the bit at the output port of said exclusive-NOR gate, which latched bit represents the result of comparing said concurrent first and second digit-serial operands.

44. Linear combining apparatus as set forth in claim 43 wherein said forced carry bit is a ZERO.

45. Linear combining apparatus as set forth in claim 43 wherein said forced carry bit is a ONE.

46. Linear combining apparatus as set forth in claim 43 wherein said means for supplying a digit-serial output signal response to the bits supplied at the sum output ports of said first through $n^{th}$ full adders comprises:

respective means for delaying each of the bits supplied at the sum output ports of said first through $n^{th}$ full adders until the next output cycle to generate said digit-serial output signal.

47. A plurality of linear combining apparatus as set forth in claim 46 connected in a chain within a system for dividing said first operands by respective ones of said third operands, which chain further comprises before each linear combining apparatus except the first in said chain:

a respective digit-serial shifter for shifting said digit-serial output signal of the preceding linear combining apparatus one bit place towards greater significance and discarding that bit in the most significant bit place before shift occurred;

a respective delay line for augmenting the delay of the shift results so they are W/n digit intervals later than the first and second operands received by the preceding linear combining apparatus, which delayed shift results are then applied as third operand to the linear combining apparatus next after said preceding linear combining apparatus in said chain; and a respective further delay line for delaying the third operand as applied to each preceding linear combining apparatus by W/n digit intervals for application to the next succeeding linear combining apparatus in said chain, so that respective bits of the quotient are successively supplied from said digital latches.

48. A system for dividing as set forth in claim 47 further including:

a differential delay network for providing parallel-in-time responses to the respective bits of the quotient.

49. A system for dividing as set forth in claim 48 still further including:

a parallel-to-digit serial converter for converting said parallel-in-time responses to the respective bits of the quotient to a digit-serial representation of said quotient.

50. Apparatus for dividing a digit-serial first operand by a positive digit-serial second operand, said first and second operands each having words of W bits simultaneously supplied during respective clock intervals as successive W/n digits of n bits apiece in a binary arithmetic, n being a plural integer and W being a multiple at least two of n, the relatively less significant digits of each word preceding the relatively more significant digits, the accompanying sign bit if any of each word included in its most significant digit, the bits of each digit being respectively identified by consecutive ordinal numbers first through $n^{th}$ in order of their increasing significance; said apparatus for dividing apparatus comprising;

a plurality p in number of digit-serial linear combining apparatuses respectively identified by consecutive ordinal numbers first through $p^{th}$, each linear combining apparatus being conditioned to operate as a digit-serial adder by a respective mode control signal being a ZERO, each linear combining apparatus being conditioned to operate as a digit-serial subtractor by its said respective mode control signal being a ONE, each linear combining apparatus having a respective n-bit-wide augend/minuend input port, a respective n-bit-wide addend/subtrahend input port, a carry input port receptive of its respective mode control signal, and a respective n-bit-wide sum/difference output port;

means for applying the first and second operands to the n-bit-wide augend/minuend input port of said first linear combining apparatus and to the n-bit-wide addend/subtrahend input port of said first linear combining apparatus, respectively;

a delay line for delaying the second operand as applied to the respective n-bit-wide addend/subtrahend input port of each of said first through $p^{th}$ linear combining apparatuses by W/n digit intervals for application to the respective n-bit-wide addend/subtrahend input port of the linear combining apparatus identified by the next higher consecutive ordinal number;

a respective cascade connection from the n-bit-wide sum/difference output port of each of said first through $(p-1)^{th}$ linear combining apparatuses to the augend/minuend input port of said linear combining apparatus identified by the next higher consecutive ordinal number, which respective cascade connection includes a respective digit-serial shifter for responding to its digit-serial input signal to generate respective shift results in which output signal appears all the bits of its digit-serial input signal except the most significant shifted one bit place towards greater significance and in the first digit of each word of which output signal appears a ZERO as least significant bit, and which respective cascade connection further includes a respective delay line for augmenting the delay of the respective shift results so they are W/n digit intervals later than the first and second operands received by the preceding linear combining apparatus;

respective comparator means corresponding to each of said digit-serial linear combining apparatuses, each comparing the first and second operands received by its corresponding digit-serial linear combining apparatus to generate a respective comparator output signal identified by the same ordinal number as its corresponding digit-serial linear combining apparatus, each which comparator output signal represents a respective bit of the quotient for dividing a digit-serial first operand by a positive digit-serial second operand;

means for applying the complement of the sign bit of the first operand as mode signal to the first linear combining apparatus; and means for applying said first through $(p-1)^{th}$ comparator output signals as the respective mode signals for the second through $p^{th}$ linear combining apparatuses.

51. A system for dividing as set forth in claim 50 further including:
a differential delay network for providing parallel-in-time responses to the respective bits of the quotient.

52. A system for dividing as set forth in claim 51 still further including:
a parallel-to-digit serial converter for converting said parallel-in-time responses to the respective bits of the quotient to a digit-serial representation of said quotient.

53. Apparatus for dividing a digit-serial first operand by a negative digit-serial second operand, said first and second operands each having words of W bits simultaneously supplied during respective clock intervals as successive W/n digits of n bits apiece in a binary arithmetic, n being a plural integer and W being a multiple at least two of n, the relatively less significant digits of each word preceding the relatively more significant digits, the sign bit if any of each word included in its most significant digit, the bits of each digit being respectively identified by consecutive ordinal numbers first through $n^{th}$ in order of their increasing significance; said apparatus for dividing apparatus comprising;

a plurality p in number of digit-serial linear combining apparatuses respectively identified by consecutive ordinal numbers first through $p^{th}$, each linear combining apparatus being conditioned to operate as a digit-serial adder by a respective mode control signal being a ZERO, each linear combining apparatus being conditioned to operate as a digit-serial subtractor by its said respective mode control signal being a ONE, each linear combining apparatus having a respective n-bit-wide augend/minuend input port, a respective n-bit-wide addend/subtrahend input port, a carry input port receptive of its respective mode control signal, and a respective n-bit-wide sum/difference output port;

means for applying the first and second operands to the n-bit-wide augend/minuend input port of said first linear combining apparatus and to the n-bit-wide addend/subtrahend input port of said first linear combining apparatus, respectively;

a delay line for delaying the second operand as applied to the respective n-bit-wide addend/subtrahend input port of each of said first through $p^{th}$ linear combining apparatuses by W/n digit intervals for application to the respective n-bit-wide addend/subtrahend input port of the linear combining apparatus identified by the next higher consecutive ordinal number;

a respective cascade connection from the n-bit-wide sum/difference output port of each of said first through $(p-1)^{th}$ linear combining apparatuses to the augend/minuend input port of said linear combining apparatus identified by the next higher consecutive ordinal number, which respective cascade connection includes a respective digit-serial shifter for responding to its digit-serial input signal to generate respective shift results in which output signal appears all the bits of its digit-serial input signal except the most significant shifted one bit place towards greater significance and in the first digit of each word of which output signal appears a ZERO as least significant bit, and which respective cascade connection further includes a respective delay line for augmenting the delay of the respective shift results so they are W/n digit intervals later than the first and second operands received by the preceding linear combining apparatus;

respective comparator means corresponding to each of said digit-serial linear combining apparatuses, each comparing the first and second operands received by its corresponding digit-serial linear combining apparatus to generate a respective comparator output signal identified by the same ordinal number as its corresponding digit-serial linear combining apparatus;

means for applying the sign bit of the first operand as mode signal to the first linear combining apparatus; and means for applying the one's complements of said first through $(p-1)^{th}$ comparator output signals as the respective mode signals for the second through $p^{th}$ linear combining apparatuses, each which one's complement of a respective said comparator output signal represents a respective bit of the quotient for dividing a digit-serial first operand by a positive digit-serial second operand.

54. A system for dividing as set forth in claim 53 further including:
a differential delay network for providing parallel-in-time responses to the respective bits of the quotient.

55. A system for dividing as set forth in claim 54 still further including:
a parallel-to-digit serial converter for converting said parallel-in-time responses to the respective bits of the quotient to a digit-serial representation of said quotient.

56. Apparatus for dividing a digit-serial first operand by a digit-serial second operand, said first and second operands each having words of W bits simultaneously supplied during respective clock intervals as successive W/n digits of n bits apiece in two's complement binary arithmetic, n being a plural integer and W being a multiple at least two of n, the relatively less significant digits of each word preceding the relatively more significant digits, the sign bit if any of each word included in its most significant digit, the bits of each digit being respectively identified by consecutive ordinal numbers first through $n^{th}$ in order of their increasing significance; said apparatus for dividing apparatus comprising;

a plurality p in number of digit-serial linear combining apparatuses respectively identified by consecutive ordinal numbers first through $p^{th}$, each linear combining apparatus being conditioned to operate as a digit-serial adder by a respective mode control signal being a ZERO, each linear combining apparatus being conditioned to operate as a digit-serial subtractor by its said respective mode control signal being a ONE, each linear combining apparatus having a respective n-bit-wide augend/minuend input port, a respective n-bit-wide addend/subtrahend input port, a carry input port receptive of its respective mode control signal, and a respective n-bit-wide sum/difference output port;

means for applying the first and second operands to the n-bit-wide augend/minuend input port of said first linear combining apparatus and to the n-bit-wide addend/subtrahend input port of said first linear combining apparatus, respectively;

a delay line for delaying the second operand as applied to the respective n-bit-wide addend/subtrahend input port of each of said first through $p^{th}$ linear combining apparatuses by W/n digit intervals for application to the respective n-bit-wide addend/subtrahend input port of the linear combining apparatus identified by the next higher consecutive ordinal number;

a respective cascade connection from the n-bit-wide sum/difference output port of each of said first through $(p-1)^{th}$ linear combining apparatuses to the augend/minuend input port of said linear combining apparatus identified by the next higher consecutive ordinal number, which respective cascade connection includes a respective digit-serial shifter for responding to its digit-serial input signal to generate respective shift results in which output signal appears all the bits of its digit-serial input signal except the most significant shifted one bit place towards greater significance and in the first digit of each word of which output signal appears a ZERO as least significant bit, and which respective cascade connection further includes a respective delay line for augmenting the delay of the respective shift results so they are W/n digit intervals later than the first and second operands received by the preceding linear combining apparatus;

respective comparator means corresponding to each of said digit-serial linear combining apparatuses, each comparing the first and second operands received by its corresponding digit-serial linear combining apparatus to generate a comparator output signal identified by the same ordinal number as its corresponding digit-serial linear combining apparatus;

means for applying a mode signal to the first linear combining apparatus that is at least in effect an exclusive-NOR response to the sign bits of the first and second operands;

means for applying a mode signal to each of the second through $p^{th}$ linear combining apparatuses that is at least in effect an exclusive-OR response to the comparator output signal identified by the ordinal number one lower and to the sign bit of the second operand, the mode signal to each of the second through $p^{th}$ linear combining apparatuses representing a respective bit of the quotient for dividing a digit-serial first operand by a positive digit-serial second operand.

57. A system for dividing as set forth in claim 56 further including:
  a differential delay network for providing parallel-in-time responses to the respective bits of the quotient.

58. A system for dividing as set forth in claim 57 still further including:
  a parallel-to-digit serial converter for converting said parallel-in-time responses to the respective bits of the quotient to a digit-serial representation of said quotient.

* * * * *